United States Patent
Ochi et al.

(10) Patent No.: US 12,232,315 B2
(45) Date of Patent: Feb. 18, 2025

(54) SEMICONDUCTOR STORAGE DEVICE

(71) Applicant: KIOXIA CORPORATION, Tokyo (JP)

(72) Inventors: Yusuke Ochi, Yokkaichi Mie (JP); Ryota Katsumata, Yokkaichi Mie (JP); Masahiro Fukuda, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 796 days.

(21) Appl. No.: 17/409,741

(22) Filed: Aug. 23, 2021

(65) Prior Publication Data
US 2022/0293621 A1    Sep. 15, 2022

(30) Foreign Application Priority Data

Mar. 12, 2021  (JP) ................................. 2021-040124

(51) Int. Cl.
| | | |
|---|---|---|
| *H01L 23/528* | (2006.01) | |
| *H10B 41/10* | (2023.01) | |
| *H10B 41/27* | (2023.01) | |
| *H10B 43/10* | (2023.01) | |
| *H10B 43/27* | (2023.01) | |

(52) U.S. Cl.
CPC ............. *H10B 43/10* (2023.02); *H10B 41/10* (2023.02); *H10B 41/27* (2023.02); *H10B 43/27* (2023.02)

(58) Field of Classification Search
CPC ........ H10B 43/10; H10B 41/10; H10B 41/27; H10B 43/27; H10B 41/35; H10B 43/35; G11C 16/24; G11C 16/0483; G11C 7/18; G11C 7/24; G11C 16/22
See application file for complete search history.

(56) References Cited

U.S. PATENT DOCUMENTS

| | | | | |
|---|---|---|---|---|
| 9,929,174 B1* | 3/2018 | Mizutani | ............... | H10B 43/35 |
| 10,818,547 B2* | 10/2020 | Lim | ...................... | H10B 43/27 |
| 2010/0109071 A1* | 5/2010 | Tanaka | .................. | H10B 43/27 |
| | | | | 257/324 |
| 2016/0049419 A1* | 2/2016 | Lee | ......................... | H10B 41/35 |
| | | | | 257/314 |
| 2016/0049421 A1* | 2/2016 | Zhang | .................... | H10B 43/27 |
| | | | | 257/314 |
| 2019/0027434 A1* | 1/2019 | Jung | ...................... | H10B 43/35 |
| 2019/0096899 A1* | 3/2019 | Tagami | .................. | H10B 43/10 |
| 2019/0096901 A1 | 3/2019 | Dai et al. | | |
| 2019/0181152 A1 | 6/2019 | Choi | | |

(Continued)

FOREIGN PATENT DOCUMENTS

| | | |
|---|---|---|
| JP | 2020-205302 A | 12/2020 |
| TW | 201913971 A | 4/2019 |

(Continued)

*Primary Examiner* — Samuel Park
(74) *Attorney, Agent, or Firm* — Kim & Stewart LLP

(57) ABSTRACT

A semiconductor storage device includes a plurality of conductor layers that are stacked in a first direction and a plurality of bit lines that are spaced from each other in a second direction. Pillars extend in the first direction through the conductor layers and are electrically connected to the bit lines. An insulator is provided that divides the region in which the plurality of pillars are disposed into adjacent regions. An interval between the pillars in an end row adjacent to the insulator is greater than an interval between the pillars in an inner row that is not directly adjacent to the insulator.

14 Claims, 17 Drawing Sheets

(56) References Cited

U.S. PATENT DOCUMENTS

| | | | |
|---|---|---|---|
| 2019/0267461 A1 | 8/2019 | Yada et al. | |
| 2019/0296040 A1* | 9/2019 | Fujii et al. | |
| 2020/0027800 A1* | 1/2020 | Yamamoto | H10B 41/50 |
| 2020/0251489 A1* | 8/2020 | Tsutsumi | H10B 41/35 |
| 2020/0266207 A1 | 8/2020 | Liu | |
| 2020/0395341 A1 | 12/2020 | Maejima et al. | |
| 2021/0074711 A1* | 3/2021 | Suzuki | G11C 16/0483 |
| 2022/0189988 A1* | 6/2022 | Kang | H01L 24/80 |

FOREIGN PATENT DOCUMENTS

| | | |
|---|---|---|
| TW | 201941410 A | 10/2019 |
| TW | 202032766 A | 9/2020 |

\* cited by examiner

SEMICONDUCTOR STORAGE DEVICE

CROSS-REFERENCE TO RELATED APPLICATION

This application is based upon and claims the benefit of priority from Japanese Patent Application No. 2021-040124, filed Mar. 12, 2021, the entire contents of which are incorporated herein by reference.

FIELD

Embodiments described herein relate generally to a semiconductor storage device.

BACKGROUND

In a semiconductor storage device such as a NAND flash memory, a plurality of pillars and a plurality of bit lines are provided. The bit lines are arranged at a predetermined pitch above the pillars. Each bit line is connected to multiple pillars. The selection of the spacing distance (arrangement pitch or interval) between adjacent bit lines may be restricted because of requirements associated with overall device miniaturization, fabrication processes or the like. For such reasons, the arrangement of the pillars may not be arbitrarily selectable.

DETAILED DESCRIPTION

Figure 1:
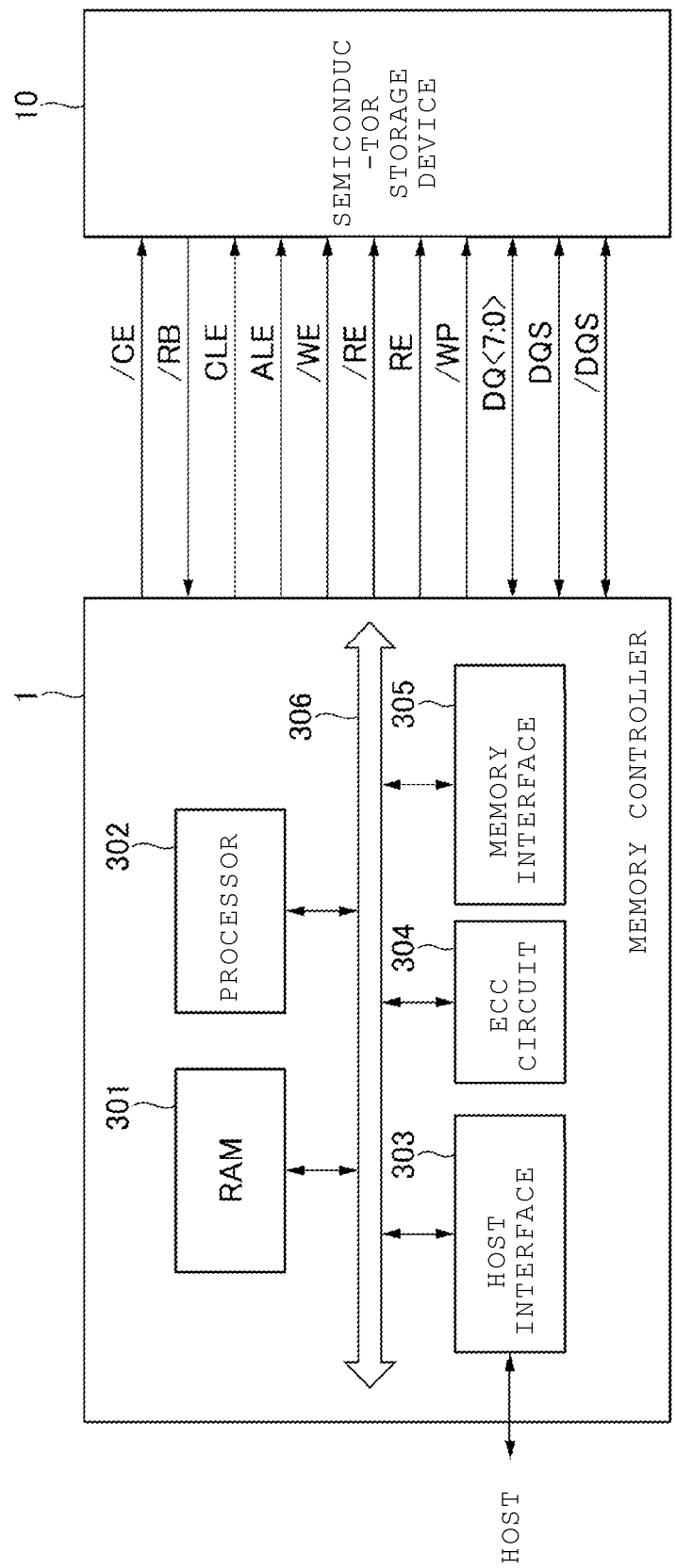
FIG. 1 is a block diagram illustrating a memory system according to a first embodiment.

Certain example embodiments provide a semiconductor storage device that can be made smaller than those in the related art.

In general, according to an embodiment, a semiconductor storage device includes a plurality of conductor layers, a plurality of bit lines, a first row of pillars, a second row of pillars, and an insulator. The plurality of conductor layers is stacked in a first direction. The plurality of bit lines is spaced from each other in a second direction that intersects the first direction. Each of the bit lines extends in a third direction intersecting the first and second directions. The first row of pillars is along the second direction. Each of the pillars in the first row extends through the plurality of conductor layers in the first direction and includes a semiconductor layer electrically connected to one of the bit lines. The second row of pillars is along the second direction. Each of the pillars in the second row extends through the plurality of conductor layers in the first direction and includes a semiconductor layer electrically connected to one of the bit lines. The first and second rows of pillars are spaced from each other in the third direction. The insulator electrically separates at least some of the conductor layers into two regions adjacent to each other in the third direction. A first interval in the second direction between adjacent pillars in the first row is less than a second interval in the second direction between adjacent pillars in the second row.

Hereinafter, the certain example embodiments will be described with reference to the accompanying drawings. In order to facilitate understanding of the description, the same components are, in general, designated by the same reference numerals in the different drawings, and duplicate description of repeated aspects may be omitted.

A first embodiment will be described. The semiconductor storage device 10 according to the first embodiment is a nonvolatile storage device comprising a NAND flash memory. FIG. 1 is a block diagram illustrating a configuration example of a memory system including a semiconductor storage device 10. This memory system includes a memory controller 1 and a semiconductor storage device 10. Although a plurality of semiconductor storage devices 10 may be actually provided in the memory system of FIG. 1, only one is illustrated in FIG. 1. The specific configuration of the semiconductor storage device 10 will be described below. This memory system may be connected to a host device ("host") or the like. The host is, for example, an electronic device such as a personal computer or a mobile terminal such as smart phone or the like.

The memory controller 1 controls writing of data to the semiconductor storage device 10 in response to a write request from the host. The memory controller 1 also controls reading of data from the semiconductor storage device 10 in response to a read request from the host.

Between the memory controller 1 and the semiconductor storage device 10, several signals such as a chip enable signal /CE, a ready/busy signal /RB, a command latch enable signal CLE, an address latch enable signal ALE, a write enable signal /WE, read enable signals RE and /RE, a write protect signal /WP, a data signal DQ <7:0>, data strobe signals DQS and /DQS are transmitted and/or received.

The chip enable signal /CE is a signal for enabling the semiconductor storage device 10. The ready/busy signal /RB is a signal for indicating whether the semiconductor storage device 10 is in a ready state or a busy state. The "ready state" is a state in which an external command can be accepted. The "busy state" is a state in which an external command cannot be accepted. The command latch enable signal CLE is a signal indicating that the signal DQ <7:0> is a command. The address latch enable signal ALE is a signal indicating that the signal DQ <7:0> is an address. The write enable signal /WE is a signal for capturing a received signal into the semiconductor storage device 10, and is asserted by the memory controller 1 each time a command, an address, and data are received. The memory controller 1 instructs the semiconductor storage device 10 to capture the signal DQ <7:0> while the signal /WE is at an "L (Low)" level.

The read enable signals RE and /RE are signals for the memory controller 1 to read data from the semiconductor storage device 10. These signals are used, for example, to control the operation timing of the semiconductor storage device 10 when outputting the signal DQ <7:0>. The write protect signal /WP is a signal for instructing the semiconductor storage device 10 to prohibit data writing and erasing. The signal DQ <7:0> is data transmitted and received between the semiconductor storage device 10 and the memory controller 1, and includes commands, addresses, and data. The data strobe signals DQS and /DQS are signals for controlling the input/output timing of the signal DQ <7:0>.

The memory controller 1 includes a RAM 301, a processor 302, a host interface 303, an ECC circuit 304, and a memory interface 305. The RAM 301, the processor 302, the host interface 303, the ECC circuit 304, and the memory interface 305 are connected to each other by an internal bus 306.

The host interface 303 outputs the request received from the host, user data (write data), and the like to the internal bus 306. Further, the host interface 303 transmits the user data read from the semiconductor storage device 10, the response from the processor 302, and the like to the host.

The memory interface 305 controls a process of writing user data and the like to the semiconductor storage device and a process of reading the user data from the semiconductor storage device 10 based on the instruction of the processor 302.

The processor 302 controls the memory controller 1 in an integrated manner. The processor 302 is, for example, a CPU, an MPU, or the like. When receiving a request from the host via the host interface 303, the processor 302 controls in response to the request. For example, the processor 302 instructs the memory interface 305 to write user data and parity to the semiconductor storage device 10 in response to the request from the host. Further, the processor 302 instructs the memory interface 305 to read the user data and the parity from the semiconductor storage device 10 in response to the request from the host.

The processor 302 determines a storage region (memory region) on the semiconductor storage device 10 with respect to the user data stored in the RAM 301. User data is stored in the RAM 301 via the internal bus 306. The processor 302 determines the memory region for the page-based data (page data), which is a write unit. The user data stored on one page of the semiconductor storage device 10 is also referred to as "unit data" below. The unit data is generally encoded and stored in the semiconductor storage device 10 as a codeword. In the present embodiment, encoding is not essential. The memory controller 1 may store the unit data in the semiconductor storage device 10 without encoding, but FIG. 1 illustrates a configuration in which encoding is performed as an example of the configuration. If the memory controller 1 does not encode, the page data will match the unit data. Further, one codeword may be generated based on one unit data, or one codeword may be generated based on the divided data in which the unit data is divided. Moreover, one codeword may be generated by using a plurality of unit data.

The processor 302 determines the memory region of the semiconductor storage device 10 to be written for each unit data. A physical address is assigned to the memory region of the semiconductor storage device 10. The processor 302 manages the memory region to which the unit data is written by using the physical address. The processor 302 specifies the determined memory region (physical address) and instructs the memory interface 305 to write user data to the semiconductor storage device 10. The processor 302 manages the correspondence between the logical address (logical address managed by the host) of the user data and the physical address. When the processor 302 receives a read request including a logical address from the host, the processor 302 identifies the physical address corresponding to the logical address, specifies the physical address, and instructs the memory interface 305 to read the user data.

The ECC circuit 304 encodes the user data stored in the RAM 301 to generate a codeword. Further, the ECC circuit 304 decodes the codeword read from the semiconductor storage device 10.

The RAM 301 temporarily stores the user data received from the host until the user data is stored in the semiconductor storage device 10, or temporarily stores the data read from the semiconductor storage device 10 until the user data is transmitted to the host. The RAM 301 is, for example, a general-purpose memory such as SRAM or DRAM.

FIG. 1 illustrates a configuration example in which the memory controller 1 includes the ECC circuit 304 and the memory interface 305, respectively. Alternatively, the ECC circuit 304 may be built in the memory interface 305. Further, the ECC circuit 304 may be built in the semiconductor storage device 10. The specific configuration and arrangement of each element illustrated in FIG. 1 are not particularly limited.

When a write request is received from the host, the memory system in FIG. 1 operates as follows. The processor 302 temporarily stores the data to be written in the RAM 301. The processor 302 reads the data stored in the RAM 301 and inputs the data to the ECC circuit 304. The ECC circuit 304 encodes the input data and inputs the codeword to the memory interface 305. The memory interface 305 writes the input codeword to the semiconductor storage device 10.

When a read request is received from the host, the memory system in FIG. 1 operates as follows. The memory interface 305 inputs the codeword read from the semiconductor storage device 10 to the ECC circuit 304. The ECC circuit 304 decodes the input codeword and stores the decoded data in the RAM 301. The processor 302 transmits the data stored in the RAM 301 to the host via the host interface 303.

Figure 2:
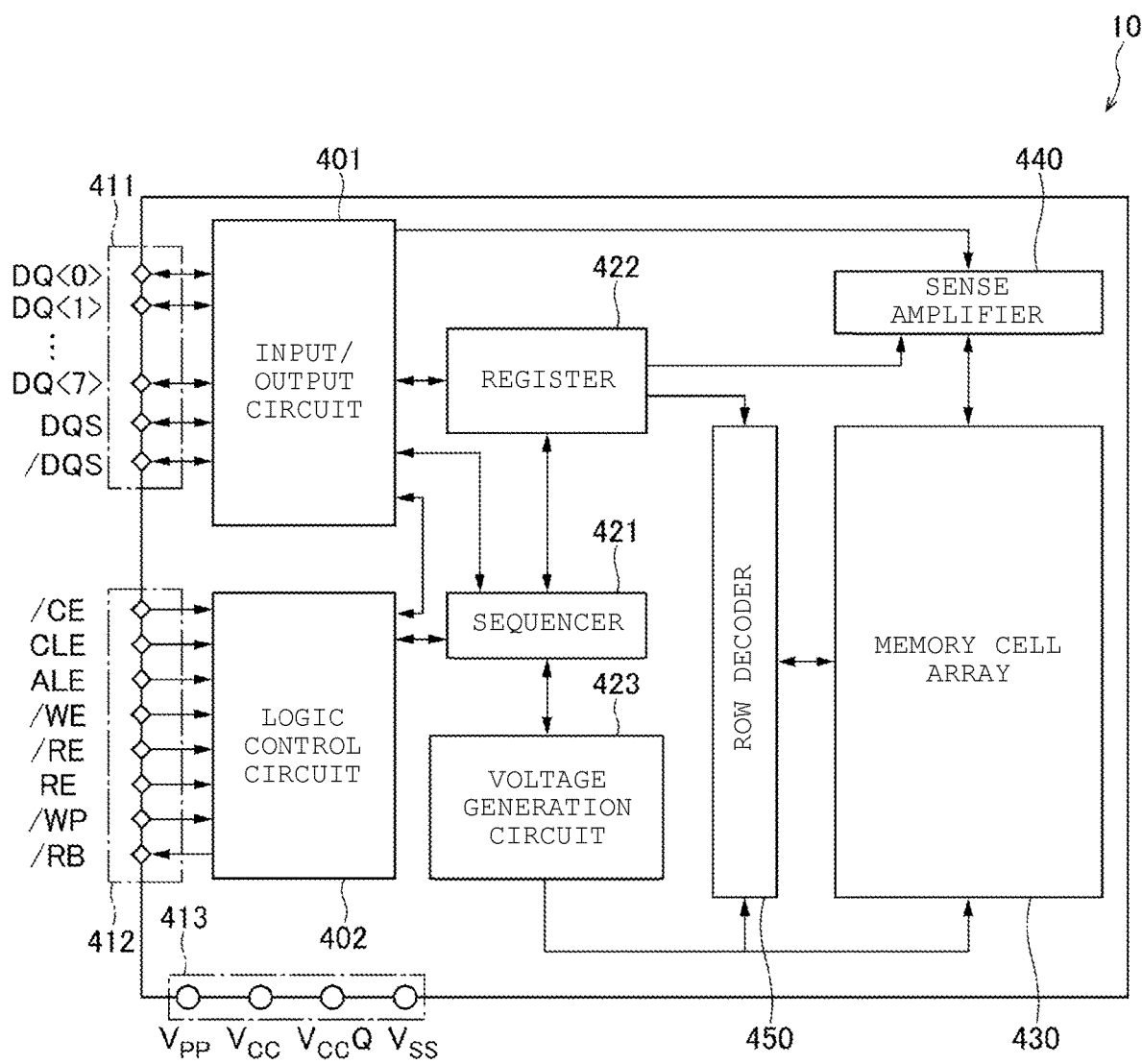
FIG. 2 is a block diagram illustrating a semiconductor storage device according to a first embodiment.

The configuration of the semiconductor storage device will be described. As illustrated in FIG. 2, the semiconductor storage device 10 includes a memory cell array 430, a sense amplifier 440, a row decoder 450, an input/output circuit 401, a logic control circuit 402, a sequencer 421, a register 422, a voltage generation circuit 423, an input/output pad group 411, a logic control pad group 412, and a power supply input terminal group 413.

The memory cell array 430 is a portion that stores data. The memory cell array 430 has a plurality of memory cell transistors MT associated with a plurality of bit lines BL and a plurality of word lines WL. The specific configuration of the memory cell array 430 will be described below with reference to FIGS. 3 to 6.

The sense amplifier 440 is a circuit for adjusting the voltage applied to the bit line BL and reading the voltage of the bit line BL and converting the read voltage into data. At the time of reading the data, the sense amplifier 440 acquires the read data read from the memory cell transistor MT to the bit line BL and transfers the acquired read data to the input/output circuit 401. When writing data, the sense amplifier 440 transfers the write data written via the bit line BL to the memory cell transistor MT. The operation of the sense amplifier 440 is controlled by the sequencer 421.

The row decoder 450 is a circuit configured as a group of switches for applying a voltage to each of the word line WLs. The row decoder 450 receives a block address and a row address from the register 422, selects the corresponding block based on the block address, and selects the corresponding word line WL based on the row address. The row decoder 450 switches the opening and closing of the above switch group so that the voltage from the voltage generation circuit 423 is applied to the selected word line WL. The operation of the row decoder 450 is controlled by the sequencer 421.

The input/output circuit 401 transmits and receives the signal DQ <7:0>, and the data strobe signals DQS and /DQS to and from the memory controller 1. The input/output circuit 401 transfers the command and address in the signal DQ <7:0> to the register 422. Further, the input/output circuit 401 transmits and receives write data and read data to and from the sense amplifier 440.

The logic control circuit 402 receives the chip enable signal /CE, the command latch enable signal CLE, the address latch enable signal ALE, the write enable signal /WE, the read enable signals RE and /RE, and the write protect signal /WP from the memory controller 1. Further, the logic control circuit 402 transfers the ready/busy signal /RB to the memory controller 1 to notify the present state of the semiconductor storage device 10 to the outside.

The sequencer 421 controls the operation of each portion including the memory cell array 430 based on the control signals input from the memory controller 1 to the input/output circuit 401 and the logic control circuit 402.

The register 422 is a portion that temporarily stores commands and addresses. The register 422 stores commands for instructing a write operation, a read operation, an erasing operation, and the like. The command is input from the memory controller 1 to the input/output circuit 401, and then transferred from the input/output circuit 401 to the register 422 and stored.

The register 422 also stores the address corresponding to the above command. The address is input from the memory controller 1 to the input/output circuit 401, and then transferred from the input/output circuit 401 to the register 422 and stored.

Further, the register 422 also stores the state information indicating the operation state of the semiconductor storage device 10. The state information is updated by the sequencer 421 each time according to the operation state of the memory cell array 430 and the like. The state information is output from the input/output circuit 401 to the memory controller 1 as a state signal in response to the request from the memory controller 1.

The voltage generation circuit 423 is a portion that generates the voltage required for each of the data write operation, read operation, and erasing operation in the memory cell array 430. Such a voltage includes, for example, a voltage applied to each word line WL, a voltage applied to each bit line BL, and the like. The operation of the voltage generation circuit 423 is controlled by the sequencer 421.

The input/output pad group 411 is a portion including a plurality of terminals (pads) for transmitting and receiving each signal between the memory controller 1 and the input/output circuit 401. Each terminal is individually provided corresponding to the signal DQ <7:0> and the data strobe signals DQS and /DQS.

The logic control pad group 412 is a portion including a plurality of terminals (pads) for transmitting and receiving each signal between the memory controller 1 and the logic control circuit 402. Each terminal is individually provided corresponding to the chip enable signal /CE, the command latch enable signal CLE, the address latch enable signal ALE, the write enable signal /WE, the read enable signal RE and /RE, the write protect signal /WP, and the ready/busy signal /RB.

The power supply input terminal group 413 is a portion including a plurality of terminals for receiving each voltage required for the operation of the semiconductor storage device 10. The voltage applied to each terminal includes power supply voltages Vcc, VccQ, and Vpp, and a ground voltage Vss.

The power supply voltage Vcc is a circuit power supply voltage supplied from the outside as an operation power supply, and is, for example, a voltage of about 3.3 V. The power supply voltage VccQ is, for example, a voltage of 1.2 V. The power supply voltage VccQ is a voltage used when transmitting and receiving signals between the memory controller 1 and the semiconductor storage device 10. The power supply voltage Vpp is a power supply voltage higher than the power supply voltage Vcc, for example, a voltage of 12 V.

Figure 3:
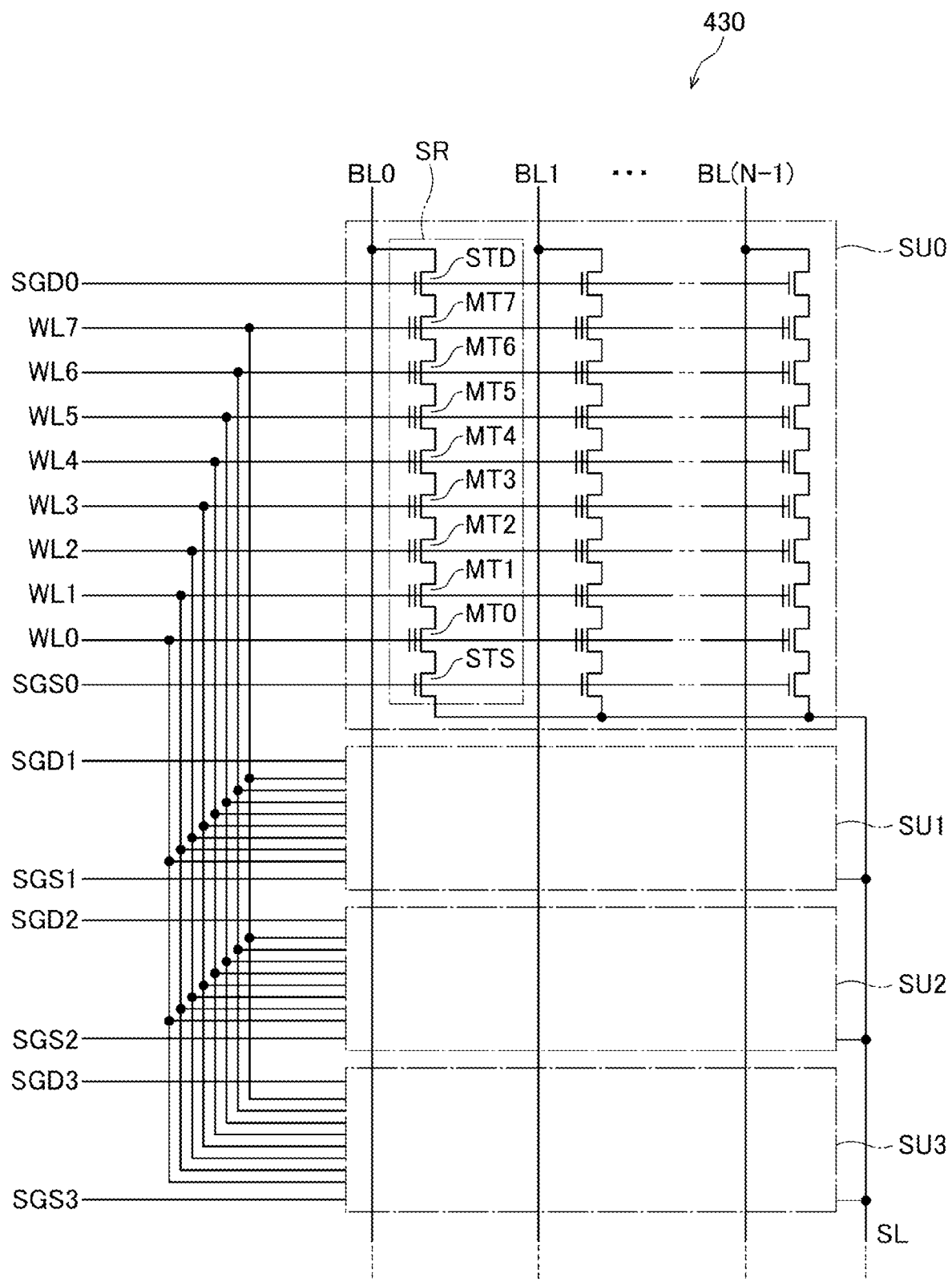
FIG. 3 is a schematic circuit diagram illustrating an equivalent circuit of a semiconductor storage device according to a first embodiment.

A specific configuration of the memory cell array 430 will be described. FIG. 3 is an equivalent circuit diagram illustrating the configuration of the memory cell array 430. As illustrated in FIG. 3, the memory cell array 430 includes a plurality of string units SU0 to SU3. Each string unit SU0 to SU3 includes a plurality of cell string SRs. Further, each cell string SR includes, for example, eight memory cell transistors MT0 to MT7 and two select transistors STD and STS. The number of memory cell transistors and select transistors in the cell string SR may be different from the example illustrated in FIG. 1.

The plurality of string units SU0 to SU3 configure one block as a whole, and a plurality of such blocks are provided in the memory cell array 430. In FIG. 3, only a single block is illustrated, and the other blocks are omitted.

In the following description, each of the string units SU0 to SU3 may be referred to as "string unit SU" without distinction. Similarly, each of the memory cell transistors MT0 to MT7 may be referred to as "memory cell transistor MT" without distinction.

Each string unit SU includes the same number of cell string SRs as N bit lines BL0 to BL (N-1) provided. N is a positive integer. The cell string SR is formed so that the memory cell transistors MT0 to MT7 and the select transistors STD and STS are arranged in series. As will be described below, the cell string SR is formed along a pillar 50 inside a memory hole MH in FIG. 4. The pillar 50 is a columnar body having a substantially cylindrical shape, and is also referred to as "memory pillar".

The memory cell transistors MT0 to MT7 in the cell string SR are disposed in series between the source of the select transistor STD and the drain of the select transistor STS. The drain of the select transistor STD is connected to one of the bit lines BL0 and the like. The source of the select transistor STS is connected to the source line SL. In the following description, each of the bit lines BL1 to BL(N-1) may be referred to as "bit line BL" without distinction.

As will be described below, each memory cell transistor MT is configured as a transistor having a charge storage layer at the gate portion. The amount of charge stored in the charge storage layer corresponds to the data stored in the memory cell transistor MT. The memory cell transistor MT may be a charge trap type using, for example, a silicon nitride film as the charge storage layer, or a floating gate type using, for example, a silicon film as the charge storage layer.

The gates of the plurality of select transistors STD in the string unit SU0 are all connected to a select gate line SGD0. The select gate line SGD0 is a line to which a voltage for switching the opening/closing of each select transistor STD is applied. Similarly, for the string units SU1 to SU3, select gate lines SGD1 to SGD3 for applying a voltage to the select transistor STD are provided corresponding to each string unit SU.

The gates of the plurality of select transistors STS in the string unit SU0 are all connected to a select gate line SGS0. The select gate line SGS0 is a line to which a voltage for switching the opening/closing of each select transistor STS is applied. Similarly, for the string units SU1 to SU3, select gate lines SGS1 to SGS3 for applying a voltage to the select transistor STS are provided corresponding to each string unit SU. The select gate line SGS may be shared between the string units SU0 to SU3 constituting one block, and the gates of all the select transistors STS in the string units SU0 to SU3 may be connected to the common select gate line SGS.

Each gate of the memory cell transistors MT0 to MT7 is connected to word lines WL0 to WL7. Voltages are applied to the word lines WL0 to WL7 for the purpose of switching the opening and closing of the memory cell transistors MT0 to MT7, changing the amount of charge accumulated in each charge storage layer of the memory cell transistors MT0 to MT7, and the like.

The writing and reading of data in the semiconductor storage device 10 are collectively performed for each unit referred to as "page" in the plurality of memory cell transistors MT connected to any word line WL in any one of the string units SU. On the other hand, the erasing of data in the semiconductor storage device 10 is collectively performed for all the memory cell transistors MT in the block. As a specific method for such writing, reading, and erasing data, various known methods may be adopted, and detailed description thereof will be omitted.

Figure 4:
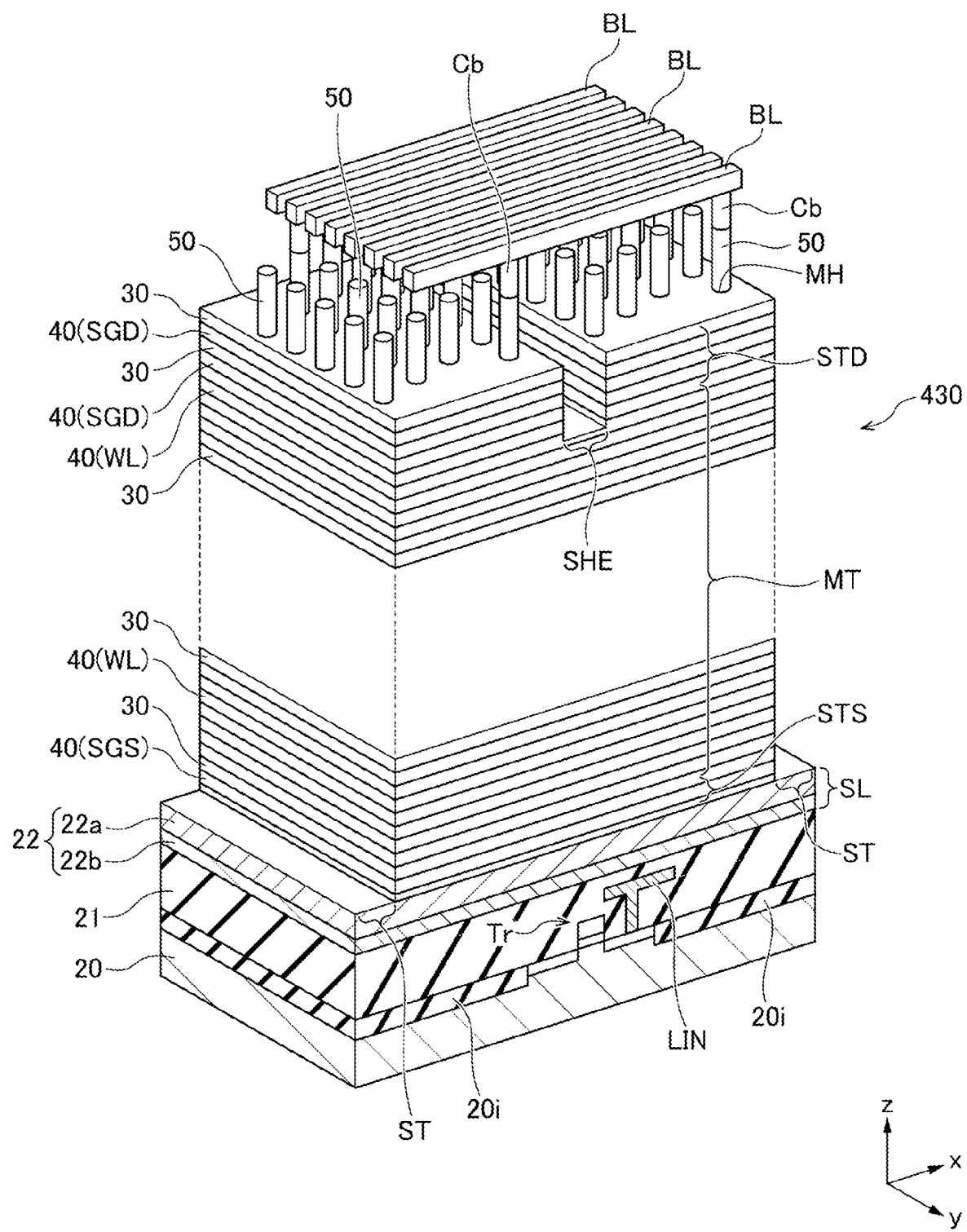
FIG. 4 schematically illustrates a perspective view of a configuration of a semiconductor storage device according to a first embodiment.

FIG. 4 schematically illustrates a perspective view of the configuration of the memory cell array 430 and the portion in the vicinity thereof of the semiconductor storage device 10. As illustrated in FIG. 4, the semiconductor storage device 10 includes a substrate 20, an insulator layer 21, a semiconductor layer 22, and a plurality of insulator layers 30 and a conductor layer 40.

The substrate 20 is a plate-shaped member having a flat surface on the z-direction side of FIG. 4, and is, for example, a silicon wafer. The insulator layer 21, the semiconductor layer 22, the insulator layer 30, the conductor layer 40, and the like described below are a plurality of layers formed by, for example, CVD film formation on the upper surface side of the substrate 20. For example, an element isolation area 20i is provided on the surface of the substrate 20. The element isolation area 20i is, for example, an insulating region containing silicon oxide, and is a part of the insulating region that partitions the source and drain regions of a transistor Tr.

The insulator layer 21 is a layer formed of an insulating material such as silicon oxide. A peripheral circuit including the above-mentioned transistor Tr, wiring LIN, and the like are formed on the surface side of the substrate 20. This peripheral circuit includes the sense amplifier 440, the row decoder 450, and the like illustrated in FIG. 2. The insulator layer 21 covers the entire peripheral circuit.

The semiconductor layer 22 is a layer that functions as the source line SL in FIG. 3. The semiconductor layer is formed of a silicon-containing material, such as impurity-doped polycrystalline silicon. The semiconductor layer 22 is embedded in the insulator layer 21 at a portion below the memory cell array 430.

The semiconductor layer 22 may be entirely formed of a semiconductor material such as silicon, but may have a two-layer structure composed of a semiconductor layer 22a and a conductive layer 22b as illustrated in the example of FIG. 4. The semiconductor layer 22a is a layer formed of a semiconductor material such as silicon, and the conductive layer 22b is a layer formed of a metal material such as tungsten.

A plurality of the insulator layer 30 and the conductor layer 40 are formed above the semiconductor layer 22 and are alternately arranged in the z direction of FIG. 4.

The conductor layer 40 is a conductive layer formed of, for example, a material containing tungsten. The conductor layers 40 are used as the word lines WL0 to WL7 and the select gate lines SGS1, SGD1, and the like in FIG. 3. The insulator layer 30 is disposed at a position between the conductor layers 40 adjacent to each other and electrically insulates between the two. The insulator layer 30 is formed of, for example, a material containing silicon oxide.

In the region where the plurality of insulator layers 30 and the conductor layers 40 are stacked in the z direction, a plurality of memory holes MH penetrate the plurality of insulator layers 30 and the conductor layers 40 in the z direction, and pillars 50 having a substantially cylindrical shape are formed inside the memory holes MH. Each pillar 50 is formed in a range from the insulator layer 30 on the most z-direction side to the semiconductor layer 22.

Figure 5:
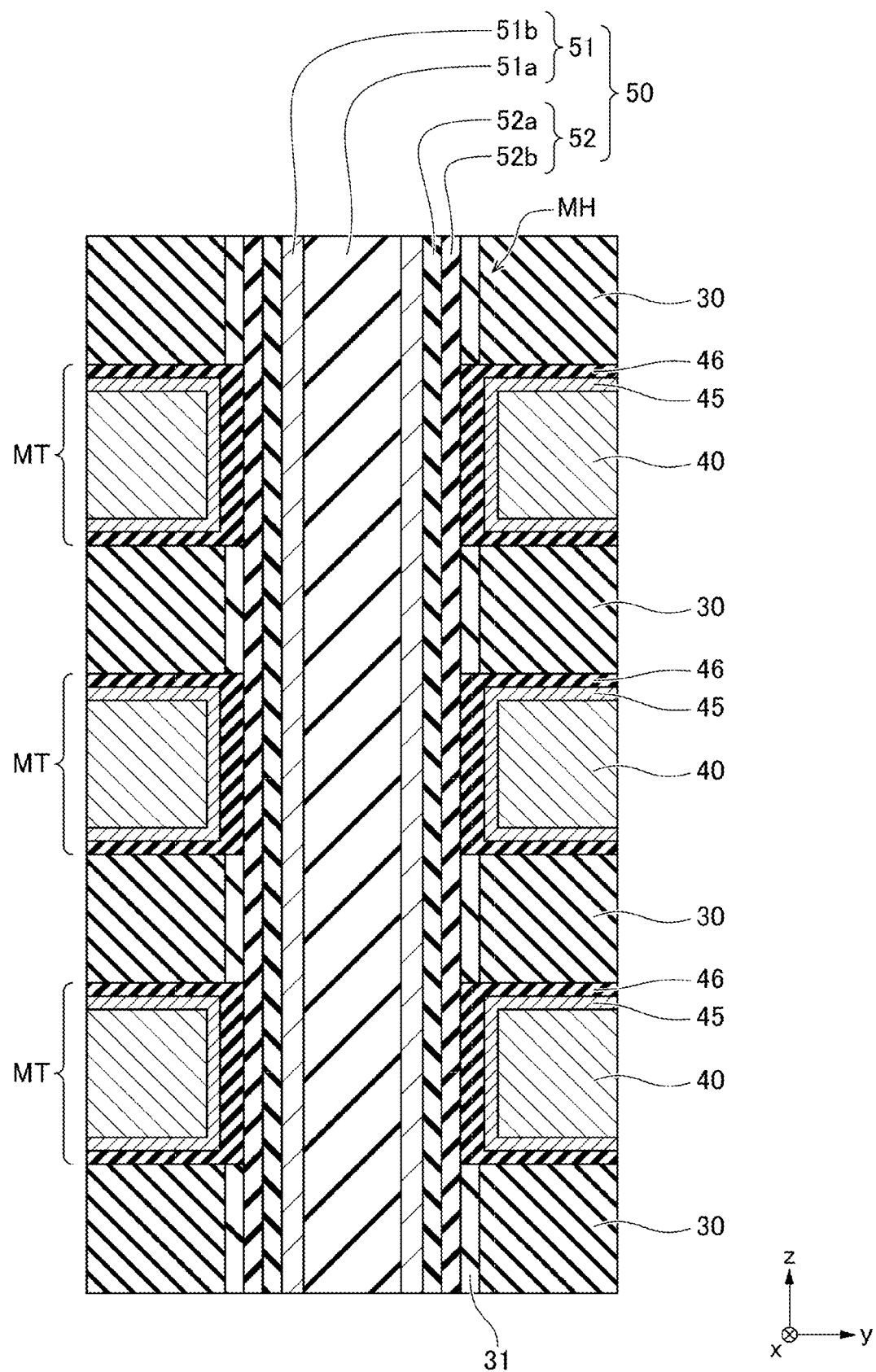
FIG. 5 schematically illustrates a cross-sectional view of a configuration of a semiconductor storage device according to a first embodiment.

FIG. 5 illustrates a cross section of the pillar 50 when cut along a plane (y-z plane) passing through the central axis along the longitudinal direction thereof. Further, FIG. 6 illustrates a cross section of the pillar 50 when cut along a plane (x-y plane) perpendicular to the central axis thereof and passing through the conductor layer 40.

Figure 6:
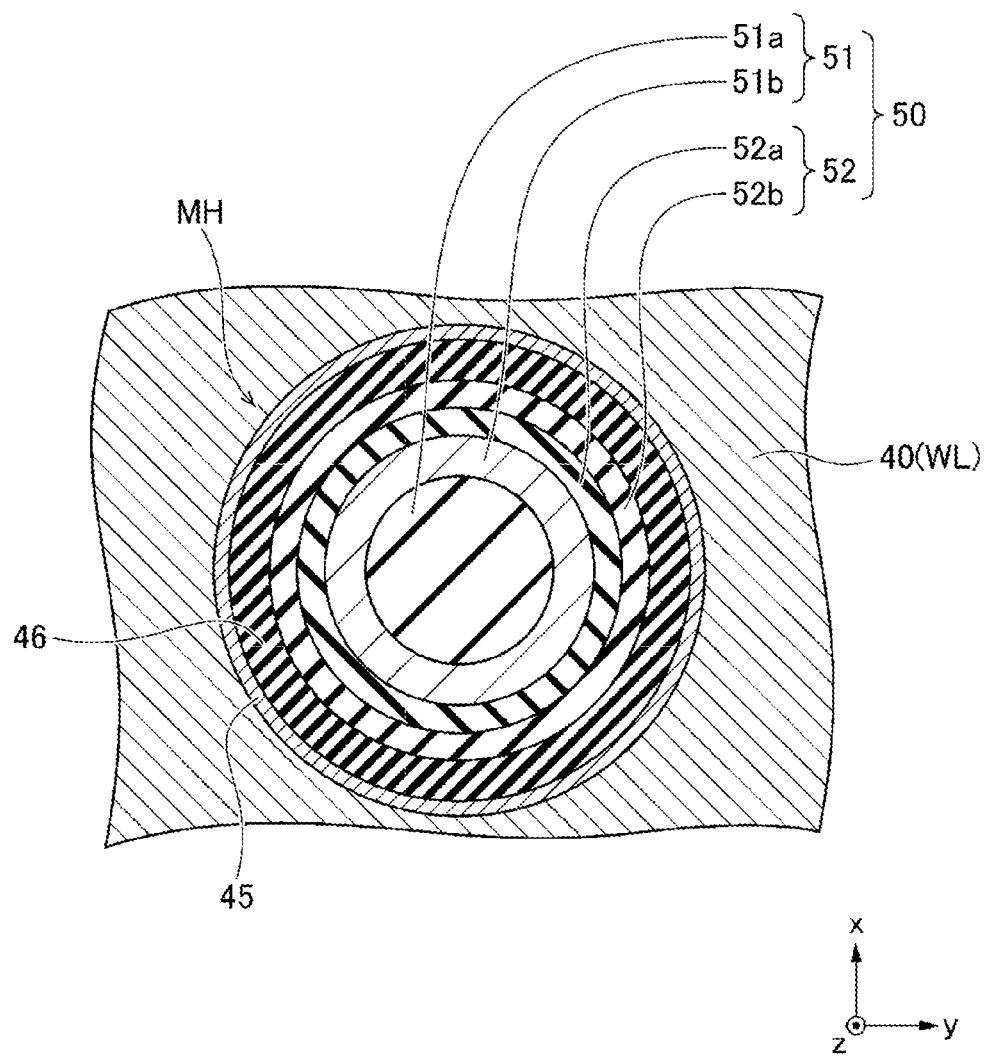
FIG. 6 schematically illustrates a cross-sectional view of a configuration of a semiconductor storage device according to a first embodiment.

As illustrated in FIG. 6, the pillar 50 has a circular or elliptical cross-sectional shape. The pillar 50 has a body 51 and a stacked film 52.

The body 51 has a core portion 51a and a semiconductor layer 51b. The semiconductor layer 51b is formed of, for example, a material made of amorphous silicon, and is a portion where a channel such as a memory cell transistor MT is formed. The core portion 51a is formed of an insulating material such as silicon oxide, and is provided inside the semiconductor layer 51b. The entire body 51 may be the semiconductor layer 51b, and the inner core portion 51a may not be provided.

The stacked film 52 is a multi-layer film covering the outer periphery of the body 51. The stacked film 52 has, for example, a tunnel insulating film 52a and a charge capture film 52b. The tunnel insulating film 52a is the innermost film formed. The tunnel insulating film 52a contains, for example, silicon oxide or silicon oxide and silicon nitride.

The tunnel insulating film 52a is a potential barrier between the body 51 and the charge capture film 52b. For example, when electrons are injected from the body 51 into the charge capture film 52b (write operation) and when holes are injected from the body 51 into the charge capture film 52b (erasing operation), electrons and holes pass (tunneling) through the potential barrier of the tunnel insulating film 52a, respectively.

The charge capture film 52b is a film covering the outside of the tunnel insulating film 52a. The charge capture film 52b contains, for example, silicon nitride and has a trap site that traps charges in the film. The portion of the charge capture film 52b sandwiched between the conductor layer 40, which is the word line WL, and the body serves as the storage region of the memory cell transistor MT, namely, as the charge storage layer described above. The threshold voltage of the memory cell transistor MT changes depending on the presence or absence of charges on the charge capture film 52b or the amount of the charges. As a result, the memory cell transistor MT stores the information.

As illustrated in FIG. 5, the outer peripheral surface of the conductor layer 40, which is the word line WL, is covered with a barrier film 45 and a block insulating film 46. The barrier film 45 is a film for improving the adhesion between the conductor layer 40 and the block insulating film 46. For the barrier film 45, for example, when the conductor layer 40 is tungsten, a stacked structural film of titanium nitride and titanium is selected.

The block insulating film 46 is a film for preventing back tunneling of charges from the conductor layer 40 to the stacked film 52 side. The block insulating film 46 is, for example, a silicon oxide film or a metal oxide film. One example of a metal oxide is an aluminum oxide.

A cover insulating film 31 is provided between the insulator layer 30 and the charge capture film 52b. The cover insulating film 31 contains, for example, silicon oxide. The cover insulating film 31 is a film for protecting the charge capture film 52b from being etched in the replacement step of replacing a sacrifice layer with the conductor layer 40. If the replacement step is not used to form the conductor layer 40, the cover insulating film 31 may be omitted.

As described above, the inside of the portion of the pillar 50 to which each conductor layer 40 is connected functions as a transistor. That is, each pillar 50 is a portion of the cell string SR illustrated in FIG. 3, and a plurality of transistors are connected in series along the longitudinal direction thereof. Each conductor layer 40 is connected to the gate of each transistor via the stacked film 52. The semiconductor layer 51b inside the transistor functions as a channel of the transistor.

A part of each of the transistors arranged in series as described above along the longitudinal direction of the pillar 50 functions as a plurality of memory cell transistors MT in FIG. 3. Further, the transistors formed on both sides of the plurality of memory cell transistors MT arranged in series function as the select transistors STD and STS in FIG. 3.

Returning to FIG. 4 and the description is continued. As illustrated in FIG. 4, the plurality of bit lines BL are provided above each pillar 50. Each bit line BL is formed as a linear wiring extending in the x direction in FIG. 4. The bit lines BL are arranged along the y direction in FIG. 4. The upper end of the pillar 50 is connected to one of the bit lines BL via a contact Cb. As a result, the semiconductor layer 51b of each pillar 50 is electrically connected to the bit line BL.

At the lower end of the pillar 50, the stacked film 52 is removed, and the semiconductor layer 51b is connected to the semiconductor layer 22. As a result, the semiconductor layer 22 that functions as the source line SL and the channel of each transistor are electrically connected.

The stacked conductor layer 40 and the insulator layer 30 are divided into a plurality of regions by a slit ST. The slit ST is a linear groove extending in the y direction of FIG. 4, and is formed to a depth reaching, for example, the semiconductor layer 22. In an example, an insulating spacer is formed on the inner surface of the slit ST, and a conductive material is then filled into the region inside the insulating spacer. The insulating spacer is, for example, silicon oxide. The conductive material is, for example, tungsten or polysilicon. With such a configuration, the slit ST can be used, for example, as a wiring for adjusting the potential of the semiconductor layer 22. The insulating spacer formed on the inner surface of the slit ST is also referred to as "insulator 91" below.

The upper portion of the stacked conductor layer 40 and the insulator layer 30 is separated by a slit SHE. The slit SHE is a shallow groove extending in the y direction in FIG. 4. The slit SHE is formed to a depth that extends only into the conductor layer 40 provided as the select gate wire SGD among the plurality of conductor layers 40. The inside of the slit SHE is filled with, for example, an insulating material. The insulating spacer filled inside the slit SHE is also referred to as "insulator 92" below.

Hereinafter, the configuration of each portion will be described by using the x direction, y direction, and z direction illustrated in FIG. 4. The z direction is a direction from the bottom to the top in the figure, and is the direction along which the plurality of conductor layers are stacked. The x direction is a direction that intersects the z direction, and is the direction in which each bit line BL extends. The y direction is a direction that intersects both the z direction and the x direction, and is the direction in which the plurality of bit lines BL are spaced from each other.

Figure 7:
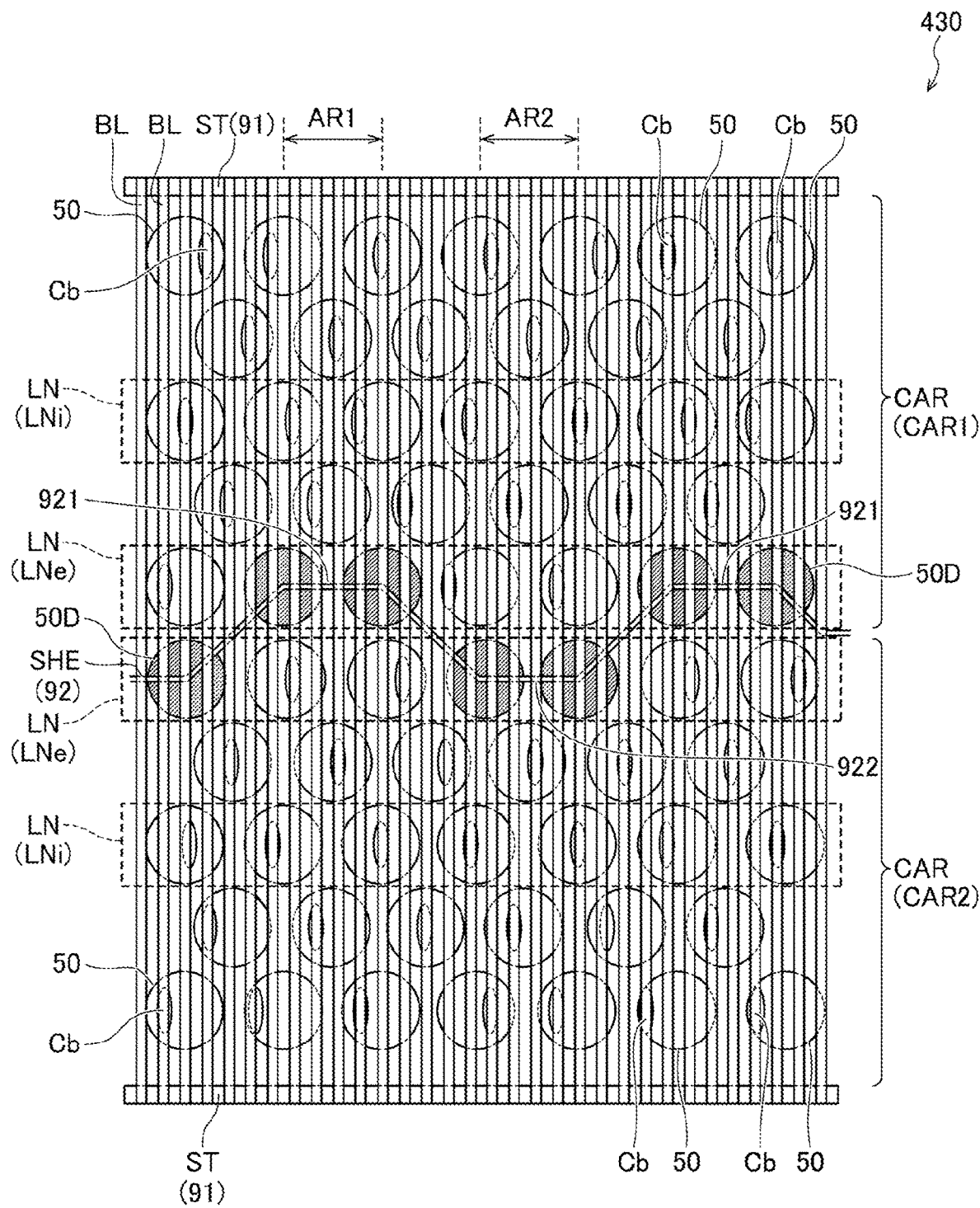
FIG. 7 schematically illustrates a plan view of an arrangement of pillars according to a first embodiment.

A specific arrangement of the pillars 50 and the like in the first embodiment will be described with reference to FIG. 7. In FIG. 7, the configuration of the portion of the memory cell array 430 between a pair of slits ST, that is, the configuration of the portion between a pair of insulators 91 is schematically illustrated in a top plan view.

As illustrated in FIG. 7, the region where the plurality of pillars 50 are disposed in the top plan view is divided into a plurality of regions by the insulator 91 of the slit ST and the insulator 92 of the slit SHE. Each region divided in this way is also referred to as "cell region CAR" below. In addition, each cell region CAR may be distinguished from each other and may be referred to as "cell region CAR1" or "cell region CAR2". In the example of FIG. 7, the portion between the slit ST on the x direction side and the slit SHE on the -x direction side is the cell region CAR1. Further, the portion between the slit ST on the -x direction side and the slit SHE on the x direction side is the cell region CAR2.

The slit ST and the slit SHE divide the region where the plurality of pillars 50 are disposed into a plurality of cell regions CAR arranged in the x direction by the insulators 91 and 92 provided inside the slits ST and the slit SHE, respectively. Each of the insulators 91 and 92 extends in the plurality of conductor layers 40 in the z direction and the y direction and divides the plurality of conductor layers 40 in the y direction.

As described above, each pillar 50 penetrates the plurality of conductor layers 40 in the z direction. A group of pillars 50 in one cell region CAR belong to a common string unit SU.

In each cell region CAR, each pillar 50 is connected to one of the bit lines BL via a contact Cb. In other words, each bit line BL is connected to one of the pillars 50 two-dimensionally disposed in a top view as illustrated in FIG. 7.

In the first embodiment, a dummy pillar 50D is formed in a part of the region between the pair of slits ST. The dummy pillar 50D has the same configuration as the pillar 50 and penetrates the conductor layers 40 in the z direction like the pillars 50. However, since the dummy pillar 50D is not connected to a bit line BL via a contact Cb, the dummy pillar 50D is not used for data storage. As illustrated in FIG. 7, when viewed along the z direction, the slit SHE and the insulator 92 inside the slit SHT pass through a position overlapping each dummy pillar 50D. In FIG. 7, the dummy pillar 50D is depicted with hatching so that the dummy pillar 50D can be distinguished from the pillar 50.

For convenience of description, the row formed by the pillars 50 arranged linearly in the y direction is also referred to as "row LN" below. In each cell region CAR, a plurality of rows LN are arranged in the x direction.

Among a plurality of rows LN, the one closest to the insulators 91 and 92 (slit ST and slit SHE) in the x direction is also referred to as "end row LNe" below. Further, among the plurality of rows LN, those located at different positions from the end row LNe in the x direction are also referred to as "inner row LNi" below. The inner row LNi may be referred to as a "first row" in the present embodiment. The plurality of pillars 50 constituting the inner row LNi may be referred to as to a "first pillar" for the first embodiment. The end row LNe may be referred to as a "second row" for the first embodiment. The plurality of pillars 50 constituting the end row LNe may be referred to as a "second pillar" for the first embodiment. In one cell region CAR, a plurality of inner rows LNi are provided, and a part of the plurality of inner rows LNi is adjacent to the end row LNe.

As illustrated in FIG. 7, in the first embodiment, the plurality of inner rows LNi are arranged in the x direction. Among a pair of inner rows LNi adjacent to each other in the x direction, the pillars 50 in one inner row LNi are disposed at positions shifted in the y direction with respect to the pillars 50 in the other inner row LNi. Further, the pillars 50 in the end row LNe are disposed at positions shifted in the y direction with respect to the pillars 50 in the inner row LNi adjacent to the end row LNe.

As illustrated in FIG. 7, the pillars 50 in the inner row LNi have a pitch of approximately equal intervals along the y direction. On the other hand, the arrangement pitch of each pillar 50 in the end row LNe on the insulator 92 (slit SHE) side (specifically, in the portion where the dummy pillar 50D is disposed) is partially expanded (enlarged) to be more than the arrangement pitch of each pillar 50 in the inner row LNi. The "arrangement pitch" in this context is the distance between centers of the pillars 50 adjacent to each other in the y direction.

In order to explain the reason for such a configuration, the configuration according to comparative examples will be described with reference to FIGS. 8 and 9.

Figure 8:
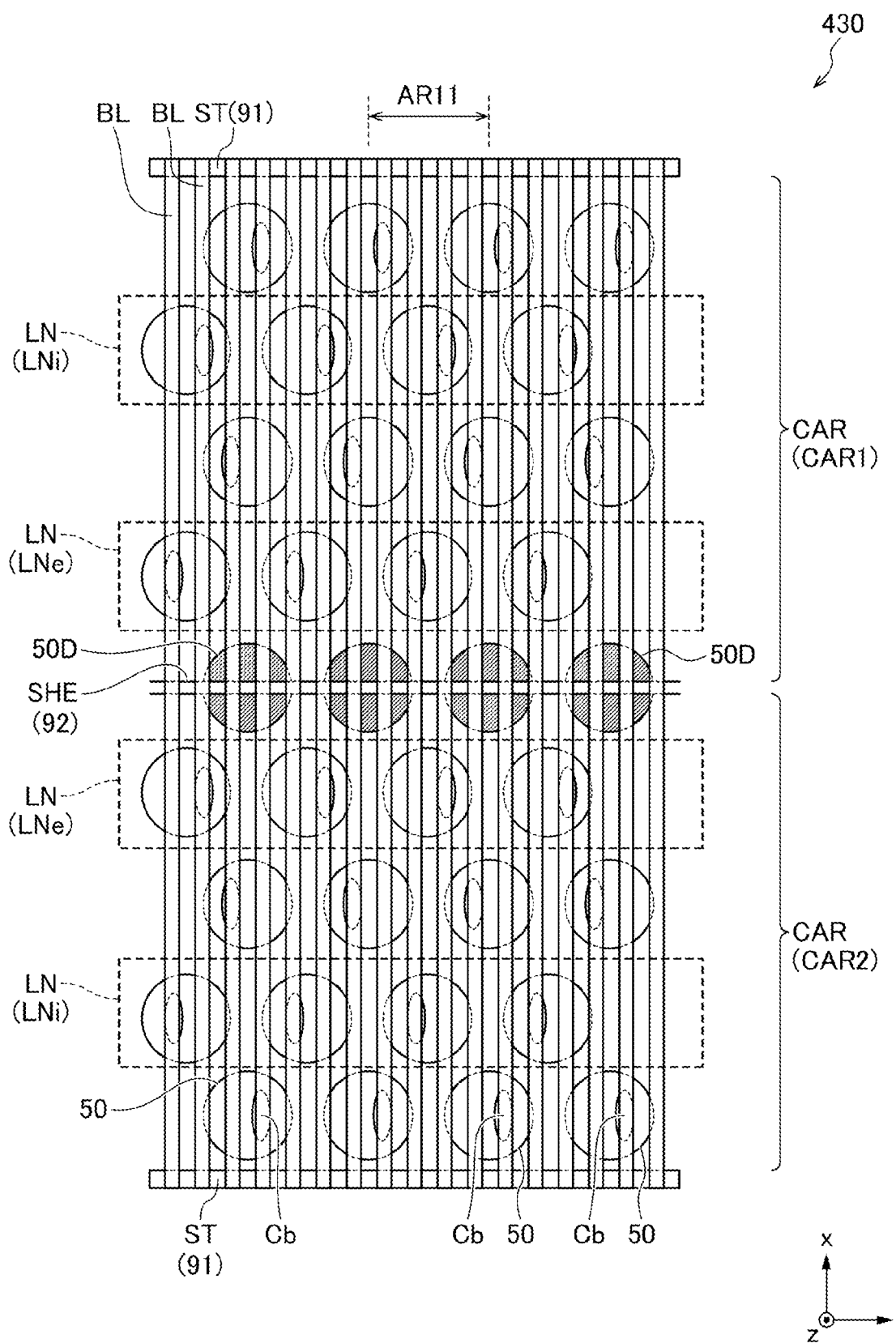
FIG. 8 schematically illustrates a plan view of an arrangement of pillars in a comparative example.

In the comparative example of FIG. 8, the dummy pillars 50D are linearly arranged along the y direction. Immediately above the dummy pillars 50D, the slit SHE and the insulator 92 also extend linearly in the y direction. In this comparative example, the pillars 50 are arranged at a pitch of approximately equal intervals within all the rows LN including the end row LNe.

In the example of FIG. 8, four rows LN are provided along the x direction in one cell region CAR. That is, if the total number of rows LN in the cell region CAR is defined as a "consecutive number", then consecutive number in the example of FIG. 8 is 4.

As described above, each bit line BL needs to be connected to one of the pillars 50 disposed in the cell region CAR. Here, if one-half of the arrangement pitch of the bit lines BL is defined as "BLHP" (Bit Line Half Pitch), then BLHP is calculated by the following equation (1):

BLHP=(arrangement pitch of pillars 50 in the y direction)/the consecutive number/2

For example, when the arrangement pitch of the pillars 50 in the y direction is 152 nm and the consecutive number is 4 (as illustrated in FIG. 8), the value of BLHP is 152/4/2=19 nm.

A range AR11 (illustrated in FIG. 8) is the distance in the y direction having the same dimension as the arrangement pitch of the pillars 50. In a cell region CAR, inside this range AR11, four pillars 50 (that is, the consecutive number of pillars) are arranged in the x direction, and therefore it is necessary to have the same number of bit lines BL within the range AR11. This is the reason why BLHP is a function of the consecutive number in Equation (1).

In order to reduce the size of the semiconductor storage device 10, it is necessary to reduce at least one of the arrangement pitch of the pillars 50 or BLHP. When the arrangement pitch of the pillars 50 is reduced, eventually a manufacturing process limit or the like approaches and it becomes increasingly difficult to make the arrangement pitch smaller via this route, thus increasing the consecutive number to make the BLHP smaller may be an alternative in some instances.

Figure 9:
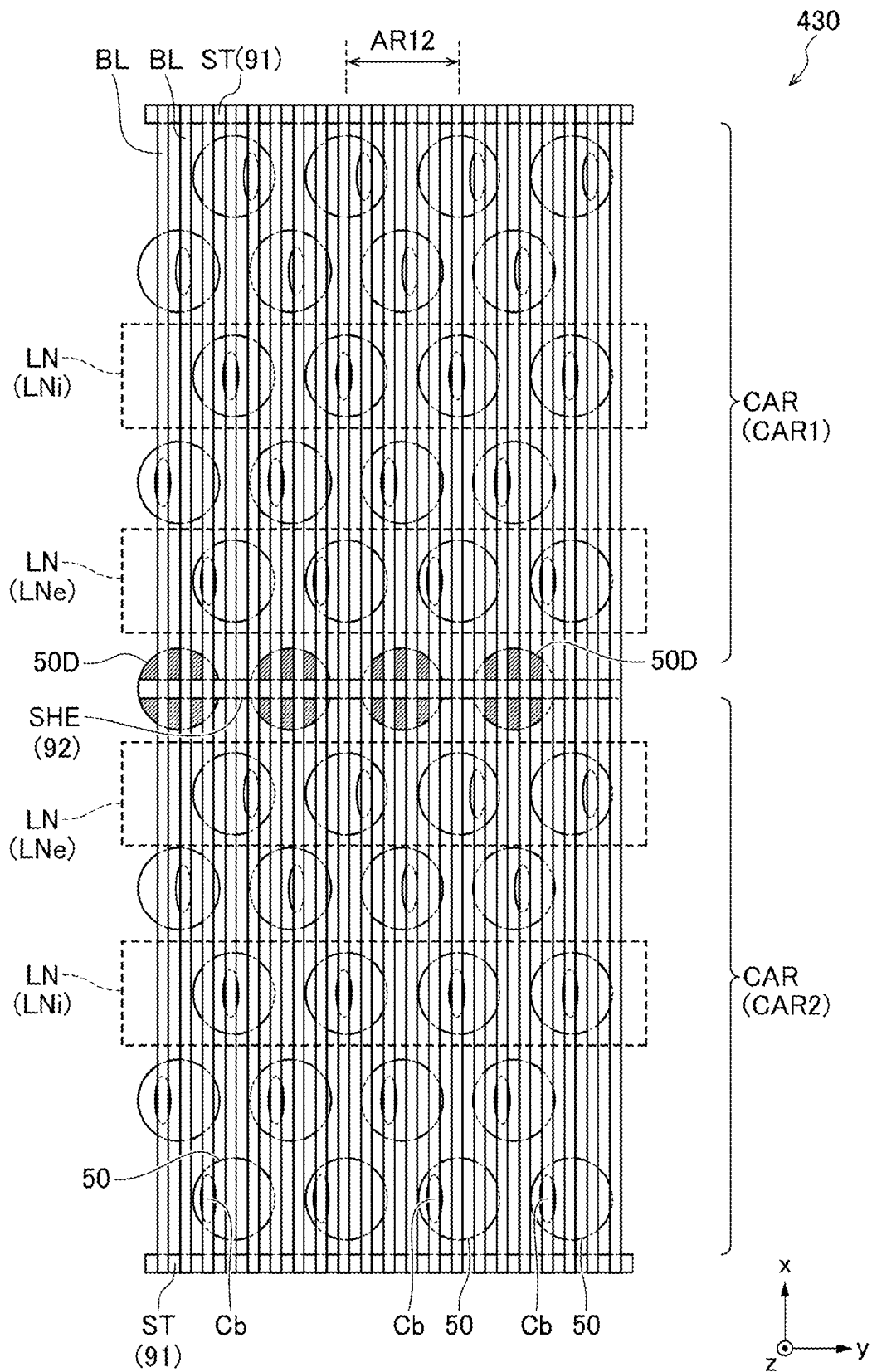
FIG. 9 schematically illustrates a plan view of an arrangement of pillars in another comparative example.

FIG. 9 illustrates an example in which the consecutive number is increased to 5 from 4 (the configuration of FIG. 8). A range AR12 illustrated in FIG. 9 is the distance in the y direction having the same dimension as the arrangement pitch of the pillars 50 , similarly to the AR11 as described above. In the example of FIG. 9, five bit lines BL are disposed in this range AR12, and as a result, the BLHP is reduced. The value of BLHP in the example of FIG. 8 was 152 nm/4/2=19 nm, whereas the value of BLHP in the example of FIG. 9 is 152 nm/5/2=15.2 nm.

In this way, if the consecutive number is increased by 1 for the purpose of reducing BLHP, the value of BLHP drops significantly from 19 nm to 15.2 nm. However, the difficulty of processing the bit lines BL may increase significantly, and therefore in reality it may be difficult to increase the consecutive number. As described above, in the configuration of the related art, since it is necessary to change the consecutive number one by one, it may be difficult to reduce the size of the semiconductor storage device 10 by reducing the BLHP.

However, as described with reference to FIG. 7, in the first embodiment, the arrangement pitch of each pillar 50 in the end row LNe on the insulator 92 (slit SHE) side is partially enlarged. Ranges AR1 and AR2 illustrated in FIG. 7 both the match the dimension of one of the arrangement pitches in FIG. 7 of the pillars 50 in the y direction. The range AR1 is the range corresponding to the portion where the arrangement pitch of pillars 50 in the end row LNe is enlarged. The range AR2 is the range corresponding to the portion where the arrangement pitch in the end row LNe is not enlarged.

Therefore, in the cell region CAR1, the consecutive number is 4 inside the range AR1 and 5 inside the range AR2. As described above, in the first embodiment, by enlarging the arrangement pitch of pillars 50 in the end row LNe, the consecutive number in the whole is set to be between 4 and 5. The region of the cell region CAR1 in the range AR1 corresponds to a "first region" in the present embodiment, and the region in the range AR2 corresponds to a "second region" in the present embodiment. The number of rows LN in the first region (4 in the present embodiment) is one less than the number of rows LN in the second region (5 in the present embodiment). Such a first region and a second region can be similarly defined in the cell regions CAR other than the cell region CAR1.

In the first embodiment, the portion where the arrangement pitch of each pillar 50 in the end row LNe is enlarged and the portion where the arrangement pitch is not enlarged are substantially the same in the dimensions along the y direction. Therefore, since the overall consecutive number can be regarded as 4.5, the value of BLHP calculated by Equation (1) is 152 nm/4.5/2=16.88 nm.

The value of BLHP (16.88 nm) is thus smaller than 19 nm, which occurs when the consecutive number is 4, but larger than 15.2 nm, which occurs when the consecutive number is 5. That is, it is possible to reduce the BLHP and the size of the semiconductor storage device 10 within a range in which the difficulty of processing the bit line BL does not increase significantly.

In the first embodiment, the insulator 92 inside the slit SHE is not linear along the y direction, and has a convex portion 921 protruding in the x direction and a convex portion 922 protruding in the −x direction.

The convex portion 921 protrudes so as to enter the portion of the cell region CAR1 on the x direction side toward the portion where the arrangement pitch of each pillar 50 in the end row LNe is enlarged. Further, the convex portion 922 protrudes so as to enter the portion of the cell region CAR2 on the −x direction side toward the portion where the arrangement pitch of each pillar 50 in the end row LNe is enlarged.

In the first embodiment, a pair of cell region CAR1 and cell region CAR2 are adjacent to each other with the insulator 92 of the slit SHE interposed therebetween. A cell region CAR1 corresponds to a "first cell region" in the first embodiment. A cell region CAR2 corresponds to a "second cell region" in the first embodiment.

The convex portions 921 and 922 are formed in the insulator 92 (slit SHE) between the two as described above. The convex portion 921 is a portion that protrudes toward a portion where the arrangement pitch of the pillars 50 in the end row LNe of the cell region CAR1 is enlarged, and corresponds to a "first convex portion" in the present embodiment. Further, the convex portion 922 is a portion that protrudes toward a portion where the arrangement pitch of the pillars 50 in the end row LNe of the cell region CAR2 is enlarged, and corresponds to a "second convex portion" in the first embodiment.

The first convex portion and the second convex portion are disposed at different positions in the y direction. With such a configuration, the dimensions of the cell regions CAR1 and CAR2 along the x direction become smaller, and therefore the semiconductor storage device 10 can be further miniaturized.

The number of bit lines BL passing above each of the pillars 50 changes according to the total quantity number of the inner rows LNi and the end rows LNe in the cell region CAR, that is, the consecutive number. In the first embodiment, the total quantity number of the inner rows LNi and the end rows LNe in each of the cell regions CAR divided by the insulators 91 and 92 is 5. In such a configuration, the number of bit lines BL passing immediately above each of the pillars 50 is approximately 3. The number of bit lines BL passing immediately above the pillars 50 is approximately 3 when the consecutive number exceeds 4 but is 6 or less. Therefore, in the first embodiment, the plurality of pillars 50 include the pillars 50 above which three bit lines BL pass directly.

A second embodiment will be described. In the following, the points different from the above-described first embodiment will be mainly described, and the points common to the first embodiment will be omitted as appropriate.

Figure 10:
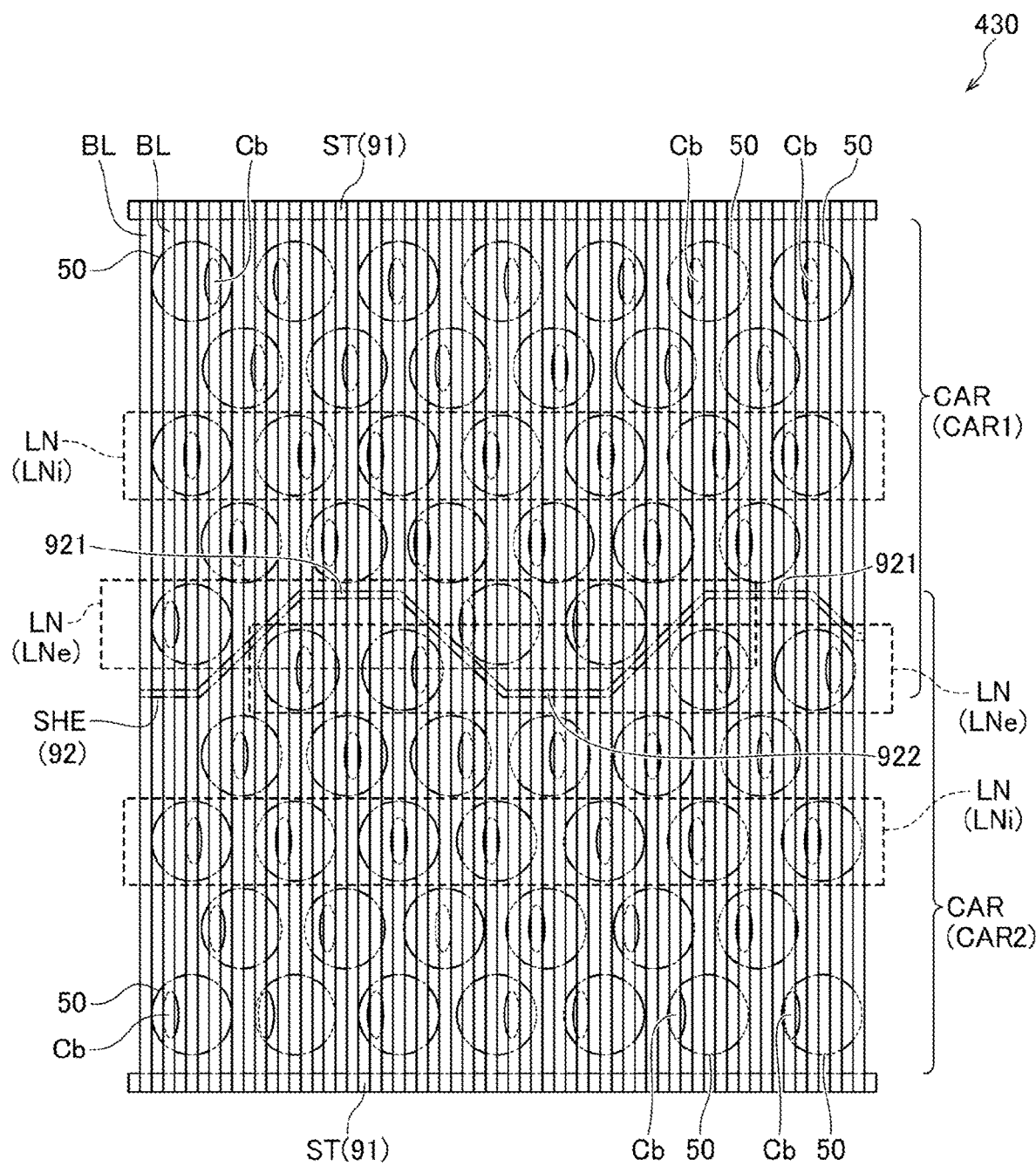
FIG. 10 schematically illustrates a plan view of an arrangement of pillars according to a second embodiment.

FIG. 10 schematically illustrates an arrangement of the pillars 50 and the like according to the second embodiment in the same manner as in FIG. 7. As illustrated in FIG. 10, the insulator 92 (slit SHE) of the second embodiment also has the convex portion 921 and the convex portion 922 as in the first embodiment. However, in the second embodiment, the dummy pillar 50D is not provided in the memory cell array 430. The insulator 92 of the second embodiment passes between the pillar 50 in the end row LNe of the cell region CAR1 and the pillar 50 in the end row LNe of the cell region CAR2.

Also in the present embodiment, in the end row LNe of the cell region CAR1, the arrangement pitch of the pillars is partially enlarged, and the first convex portion (convex portion 921) enters toward the enlarged portion. Further, in the end row LNe of the cell region CAR2, the arrangement pitch of the pillars 50 is partially enlarged, and the second convex portion (convex portion 922) enters toward the enlarged portion. In the present embodiment, since the dummy pillar 50D is not provided, the distance between the end row LNe of the cell region CAR1 and the end row LNe of the cell region CAR2 along the x direction is shorter than that in the first embodiment. Even with such a configuration, the same effect as that described in the first embodiment is obtained.

A third embodiment will be described. In the following, the points different from the above-described second embodiment will be mainly described, and the points common to the second embodiment will be omitted as appropriate.

Figure 11:
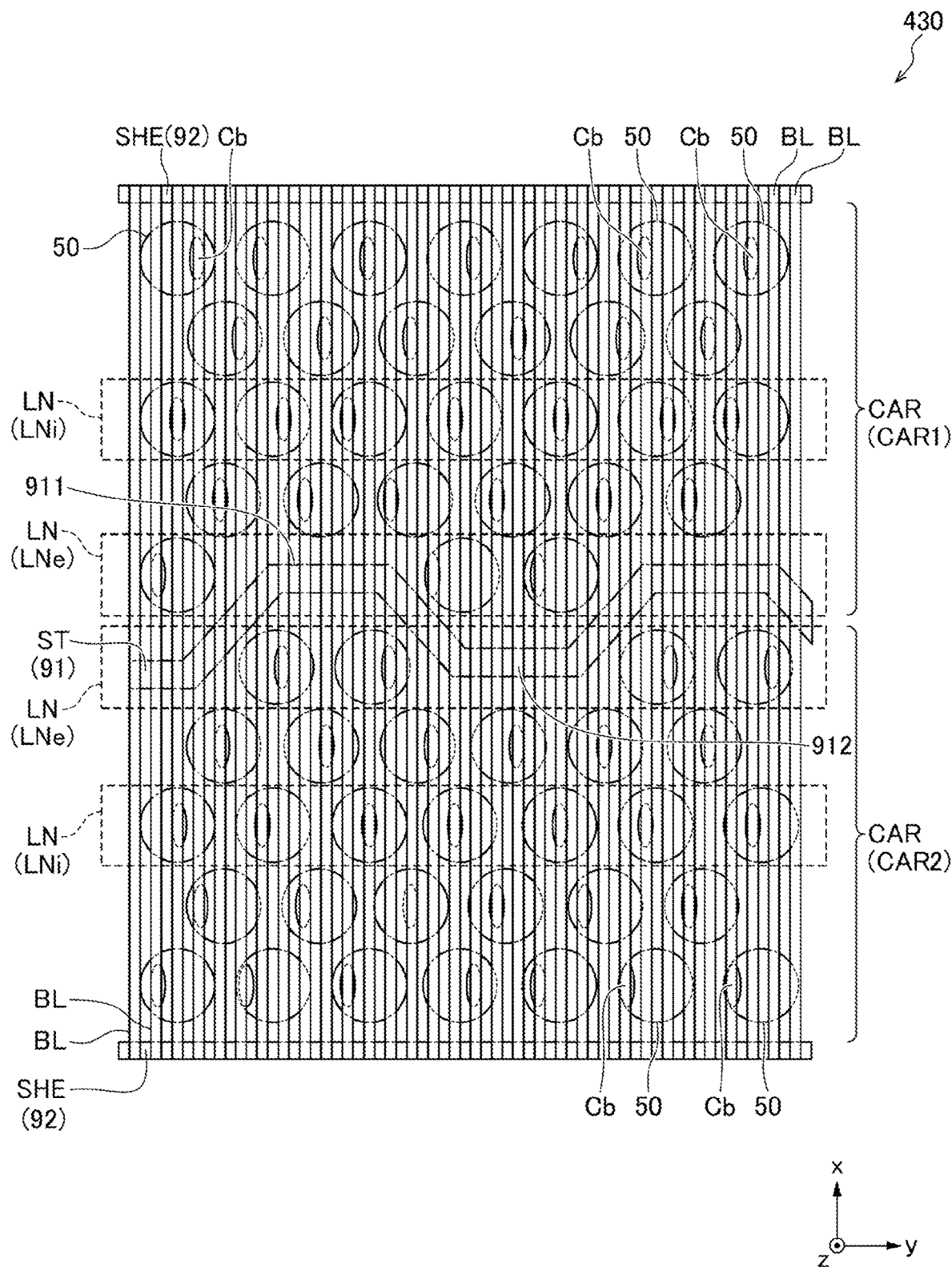
FIG. 11 schematically illustrates a plan view of an arrangement of pillars according to a third embodiment.

FIG. 11 schematically illustrates an arrangement of the pillars 50 and the like according to the third embodiment in the same manner as in FIG. 10. As illustrated in FIG. 11, in the third embodiment, each insulator 92 (slit SHE) extends linearly along the y direction. On the other hand, the insulator 91 (slit ST) has a first convex portion (convex portion 911) and a second convex portion (convex portion 912) as in the insulator 92 in the second embodiment (FIG. 10).

In the present embodiment, each of a pair of cell regions CAR adjacent to each other with the insulator 91 interposed therebetween is the cell region CAR1 (first cell region) and the cell region CAR2 (second cell region). In each cell region CAR, the arrangement pitch of each pillar 50 in the end row LNe on the insulator 91 side is partially enlarged more than the arrangement pitch of each pillar 50 in the inner row LNi.

Even with such a configuration, the same effect as that described in the first embodiment is obtained.

A fourth embodiment will be described. In the following, the points different from the first embodiment will be mainly described, and the points common to the first embodiment will be omitted as appropriate.

Figure 12:
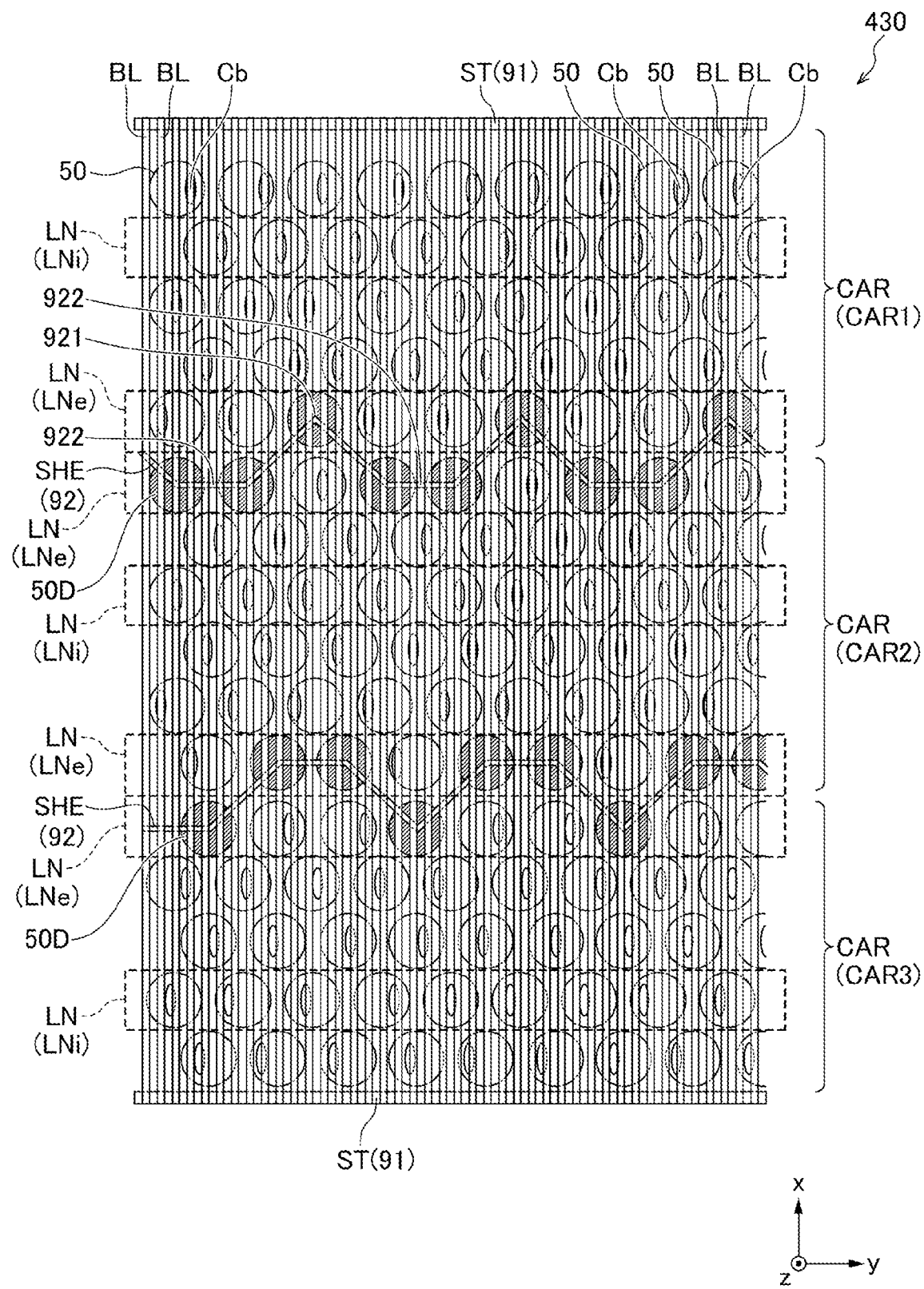
FIG. 12 schematically illustrates a plan view of an arrangement of pillars according to a fourth embodiment.

FIG. 12 schematically illustrates an arrangement of the pillars 50 and the like according to the fourth embodiment in the same manner as in FIG. 7. As illustrated in FIG. 12, in the fourth embodiment, the region between the pair of insulators 91 (slits ST) is divided into three cell regions CAR1, CAR2, and CAR3 by the two insulators 92 (slit SHE). In each cell region CAR, the arrangement pitch of each pillar 50 in the end row LNe on the insulator 92 side is partially enlarged more than the arrangement pitch of each pillar 50 in the inner row LNi.

In the end row LNe on the slit SHE side of the cell region CAR1, two pillars 50 and one dummy pillar 50D are alternately arranged in the y direction. Therefore, the number of pillars 50 in the end row LNe is ⅔ of the number of pillars 50 in the inner row LNi.

In the end row LNe on the x direction side of the cell region CAR2, one pillar 50 and two dummy pillars 50D are alternately arranged in the y direction. Therefore, the number of pillars 50 in the end row LNe is ⅓ of the number of pillars 50 in the inner row LNi.

Even in the end row LNe on the −x direction side of the cell region CAR2, one pillar 50 and two dummy pillars 50D are alternately arranged in the y direction. Therefore, the number of pillars 50 in the end row LNe is also ⅓ of the number of pillars 50 in the inner row LNi.

Therefore, in the cell region CAR2, the total value of the number of pillars 50 in the end row LNe is ⅔ of the number of pillars 50 in the inner row LNi.

In the end row LNe on the slit SHE side of the cell region CAR3, two pillars 50 and one dummy pillar 50D are alternately arranged in the y direction. Therefore, the number of pillars 50 in the end row LNe is ⅔ of the number of pillars 50 in the inner row LNi.

As described above, in any of the three cell regions CAR1, CAR2, and CAR3 provided in the present embodiment, the total value of the number of pillars 50 in the end row LNe is ⅔ of the number of pillars 50 in one inner row LNi. Since the consecutive number of each cell region CAR in the present embodiment can be regarded as 4+⅔, that is, 4.66, the value of BLHP calculated by Equation (1) is 152/4.66/2=16.28 nm.

Figure 13:
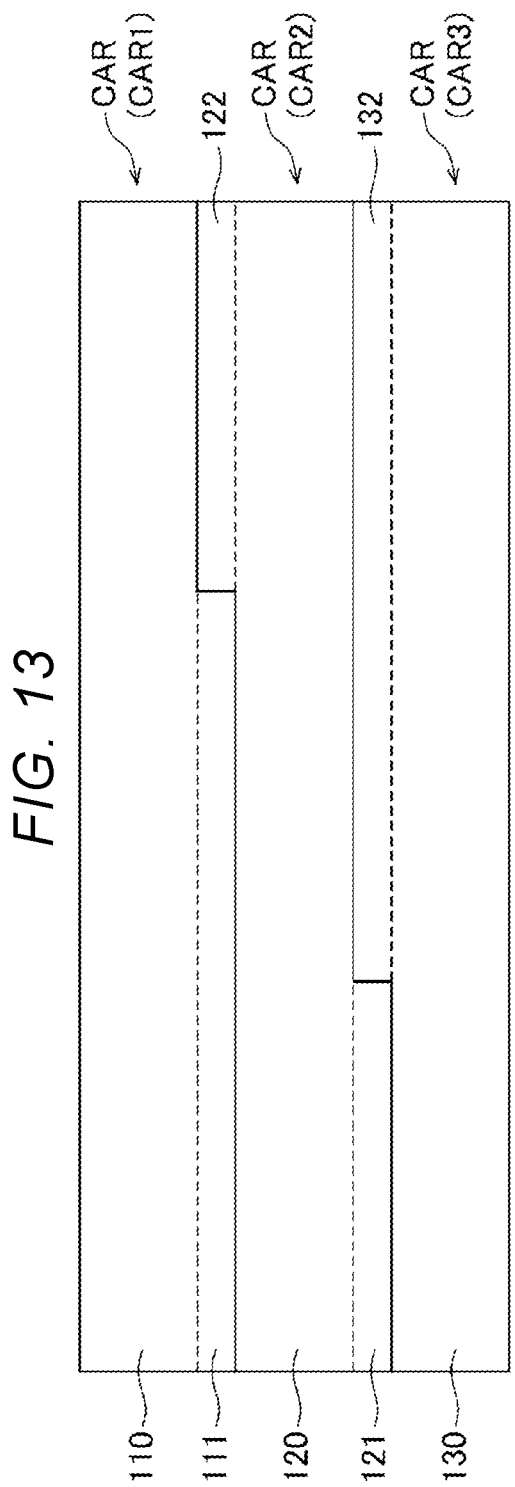
FIG. 13 schematically illustrates region separation of pillars in a fourth embodiment.

FIG. 13 schematically illustrates how the plurality of pillars 50 are distributed in the three cell regions CAR1, CAR2, and CAR3. In FIG. 13, the reference numeral 110 indicates the pillar 50 disposed in a portion of the cell region CAR1 excluding the end row LNe on the slit SHE side. Further, the reference numeral 111 indicates the pillar 50 disposed in the end row LNe on the slit SHE side of the cell region CAR1.

The reference numeral 120 indicates the pillar 50 disposed in the portion of the cell region CAR2 (that is, each inner row LNi) excluding the two end rows LNe. Further, the reference numeral 121 indicates the pillar 50 disposed in the end row LNe on the −x direction side of the cell region CAR2. Further, the reference numeral 122 indicates the pillar 50 disposed in the end row LNe on the x direction side of the cell region CAR2.

The reference numeral 130 indicates the pillar 50 disposed in the portion of the cell region CAR3 excluding the end row LNe on the slit SHE side. Further, the reference numeral 132 indicates the pillar 50 disposed in the end row LNe on the slit SHE side of the cell region CAR3.

As described above, the number of pillars 50 in the portion marked with the reference numeral 111 is ⅔ of the number of pillars 50 in the inner row LNi. Further, the number of pillars 50 in the portion marked with the reference numeral 122 is ⅓ of the number of pillars 50 in the inner row LNi. The portion marked with the reference numeral 111 and the portion marked with the reference numeral 122 are the portions in which the pillars 50 for one row of the inner row LNi are divided between the cell region CAR1 and the cell region CAR2. Similarly, the portion marked with the reference numeral 121 and the portion with the reference numeral 132 are the portions in which the pillars 50 for one row of the inner row LNi is divided between the cell region CAR2 and the cell region CAR3.

Assuming that the number of cell regions CAR arranged in the x direction, that is, the number of cell regions CAR divided by the insulators 91 and 92 is "n" (n=3 in the present embodiment), the arrangement pitch of the pillars 50 in the end row LNe may be adjusted so that the total value of the number of pillars 50 in the end row LNe of each cell region CAR is the number of the pillars 50 in one inner row LNi×(n−1)/n. The first embodiment of FIG. 7 corresponds to the case where n=2 in the above. Even with the above configuration, the same effect as that described in the first embodiment is obtained.

A fifth embodiment will be described. In the following, the points different from the first embodiment will be mainly described, and the points common to the first embodiment will be omitted as appropriate.

Figure 14:
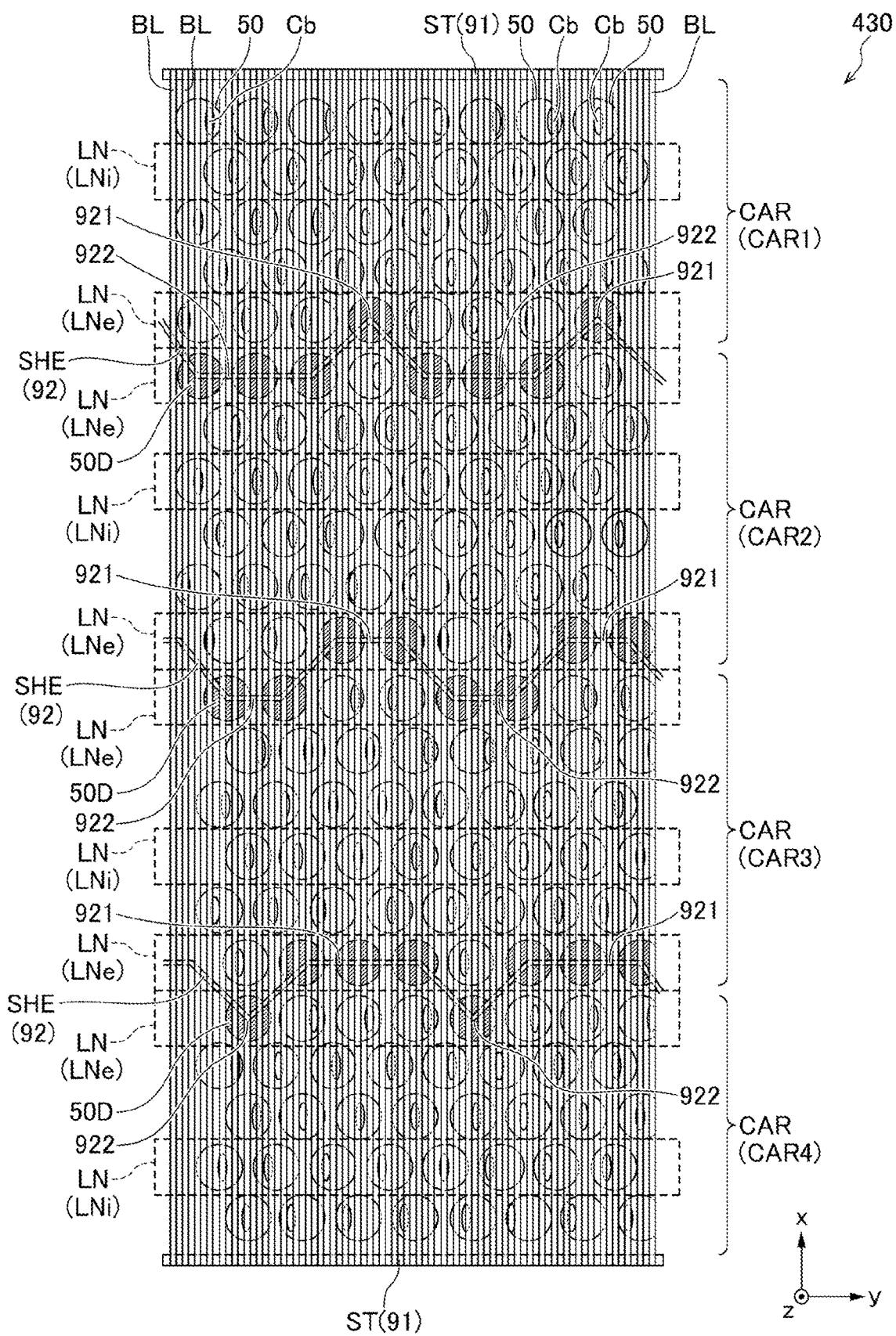
FIG. 14 schematically illustrates a plan view of an arrangement of pillars according to a fifth embodiment.

FIG. 14 schematically illustrates an arrangement of the pillars 50 and the like according to the fifth embodiment in the same manner as in FIG. 7. As illustrated in FIG. 14, in the fifth embodiment, the region between the pair of insulators 91 (slits ST) is divided into four cell regions CAR1, CAR2, CAR3, and CAR4 by the three insulators (slits SHE). In each cell region CAR, the arrangement pitch of each pillar 50 in the end row LNe on the slit SHE side is partially enlarged more than the arrangement pitch of each pillar 50 in the inner row LNi.

In the end row LNe on the slit SHE side of the cell region CAR1, three pillars 50 and one dummy pillar 50D are alternately arranged in the y direction. Therefore, the number of pillars 50 in the end row LNe is ¾ of the number of pillars 50 in the inner row LNi.

In the end row LNe on the x direction side of the cell region CAR2, one pillar 50 and three dummy pillars 50D are alternately arranged in the y direction. Therefore, the number of pillars 50 in the end row LNe is ¼ of the number of pillars 50 in the inner row LNi.

In the end row LNe on the −x direction side of the cell region CAR2, two pillars 50 and two dummy pillars 50D are alternately arranged in the y direction. Therefore, the number of the pillars 50 in the end row LNe is 2/4 of the number of the pillars 50 in the inner row LNi.

Therefore, in the cell region CAR2, the total value of the number of the pillars 50 in the end row LNe is ¾ of the number of the pillars 50 in one inner row LNi.

In the end row LNe on the x direction side of the cell region CAR3, two pillars 50 and two dummy pillars 50D are alternately arranged in the y direction. Therefore, the number of the pillars 50 in the end row LNe is 2/4 of the number of the pillars 50 in the inner row LNi.

In the end row LNe on the −x direction side of the cell region CAR3, one pillar 50 and three dummy pillars 50D are alternately arranged in the y direction. Therefore, the number of pillars 50 in the end row LNe is ¼ of the number of pillars 50 in the inner row LNi.

Therefore, in the cell region CAR3, the total value of the number of the pillars 50 in the end row LNe is ¾ of the number of pillars 50 in one inner row LNi.

In the end row LNe on the slit SHE side of the cell region CAR4, three pillars 50 and one dummy pillar 50D are alternately arranged in the y direction. Therefore, the number of pillars 50 in the end row LNe is ¾ of the number of pillars 50 in the inner row LNi.

As described above, in any of the four cell regions CAR1, CAR2, CAR3, and CAR4 provided in the present embodiment, the total value of the number of the pillars 50 in the end row LNe is ¾ of the number of the pillars 50 in one inner row LNi. Since the consecutive number of each cell region CAR in the present embodiment can be regarded as 4+¾, that is, 4.75, the value of BLHP calculated by Equation (1) is 152/4.75/2=16 nm.

Figure 15:
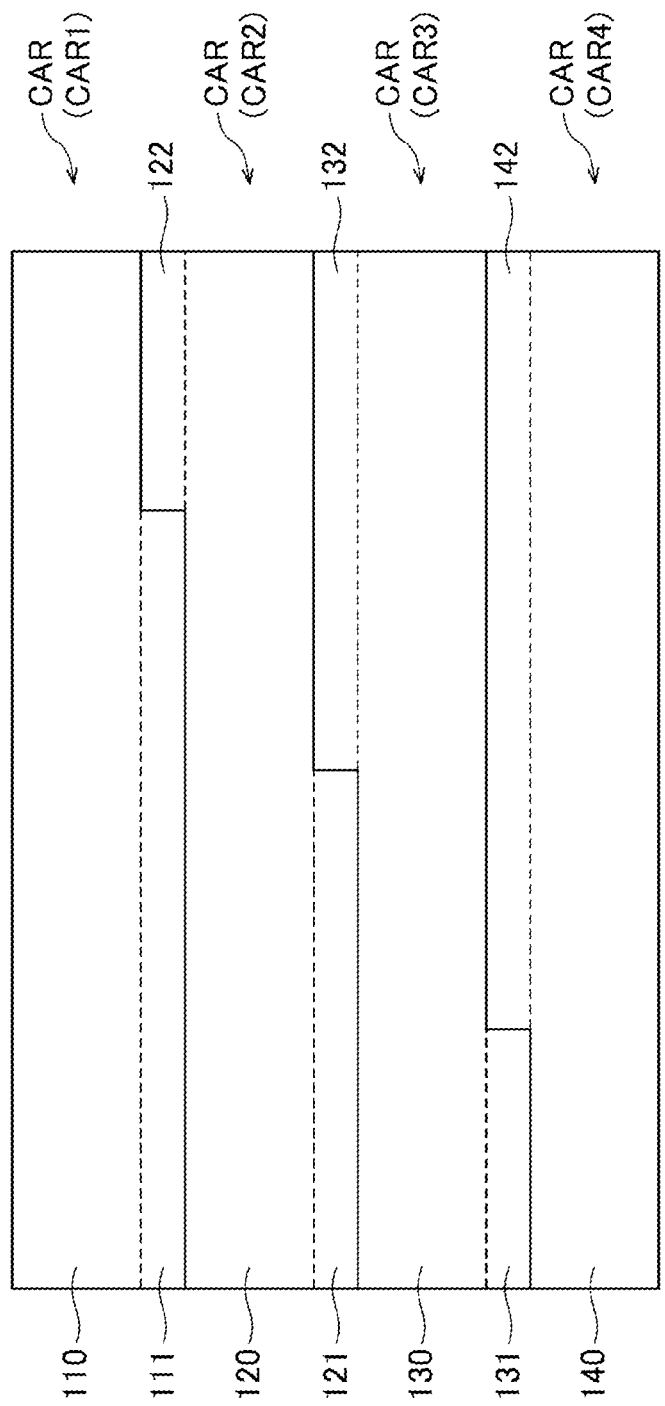
FIG. 15 schematically illustrates region separation of pillars in a fifth embodiment.

FIG. 15 schematically illustrates how the plurality of pillars 50 are distributed in the four cell regions CAR1, CAR2, CAR3, and CAR4 in the same manner as in FIG. 13. In FIG. 15, the reference numeral 110 indicates the pillar 50 disposed in a portion of the cell region CAR1 excluding the end row LNe on the slit SHE side. Further, the reference numeral 111 indicates the pillar 50 disposed in the end row LNe on the slit SHE side of the cell region CAR1.

The reference numeral 120 indicates the pillar 50 disposed in the portion of the cell region CAR2 (that is, each inner row LNi) excluding the two end rows LNe. Further, the reference numeral 121 indicates the pillar 50 disposed in the end row LNe on the -x direction side of the cell region CAR2. Further, the reference numeral 122 indicates the pillar 50 disposed in the end row LNe on the x direction side of the cell region CAR2.

The reference numeral 130 indicates the pillar 50 disposed in the portion of the cell region CAR3 (that is, each inner row LNi) excluding the two end rows LNe. Further, the reference numeral 131 indicates the pillar 50 disposed in the end row LNe on the -x direction side of the cell region CAR3. Further, the reference numeral 132 indicates the pillar 50 disposed in the end row LNe on the x direction side of the cell region CAR3.

The reference numeral 140 indicates the pillar 50 disposed in the portion of the cell region CAR4 excluding the end row LNe on the slit SHE side. Further, the reference numeral 142 indicates the pillar 50 disposed in the end row LNe on the slit SHE side of the cell region CAR4.

As described above, the number of pillars 50 in the portion marked with the reference numeral 111 is ¾ of the number of pillars 50 in the inner row LNi. Further, the number of pillars 50 in the portion marked with reference numeral 122 is ¼ of the number of pillars 50 in the inner row LNi. The portion marked with the reference numeral 111 and the portion marked with the reference numeral 122 are the portions in which the pillars 50 for one row of the inner row LNi are divided between the cell region CAR1 and the cell region CAR2. Similarly, the portion marked with the reference numeral 121 and the portion with the reference numeral 132 are the portions in which the pillars 50 for one row of the inner row LNi is divided between the cell region CAR2 and the cell region CAR3. Further, the portion marked with the reference numeral 131 and the portion marked with the reference numeral 142 are the portions in which the pillars 50 for one row of the inner row LNi is divided between the cell region CAR3 and the cell region CAR4.

As described in the fourth embodiment, assuming that the number of cell regions CAR arranged in the x direction, that is, the number of cell regions CAR divided by the insulators 91 and 92 is "n", the arrangement pitch of the pillars 50 in the end row LNe may be adjusted so that the total value of the number of pillars 50 in the end row LNe of each cell region CAR is the number of the pillars 50 in one inner row LNi×(n−1)/n. The present embodiment corresponds to the case where n=4 in the above. Even with the above configuration, the same effect as that described in the first embodiment is obtained.

A sixth embodiment will be described. In the following, the points different from the first embodiment will be mainly described, and the points common to the first embodiment will be omitted as appropriate.

Figure 16:
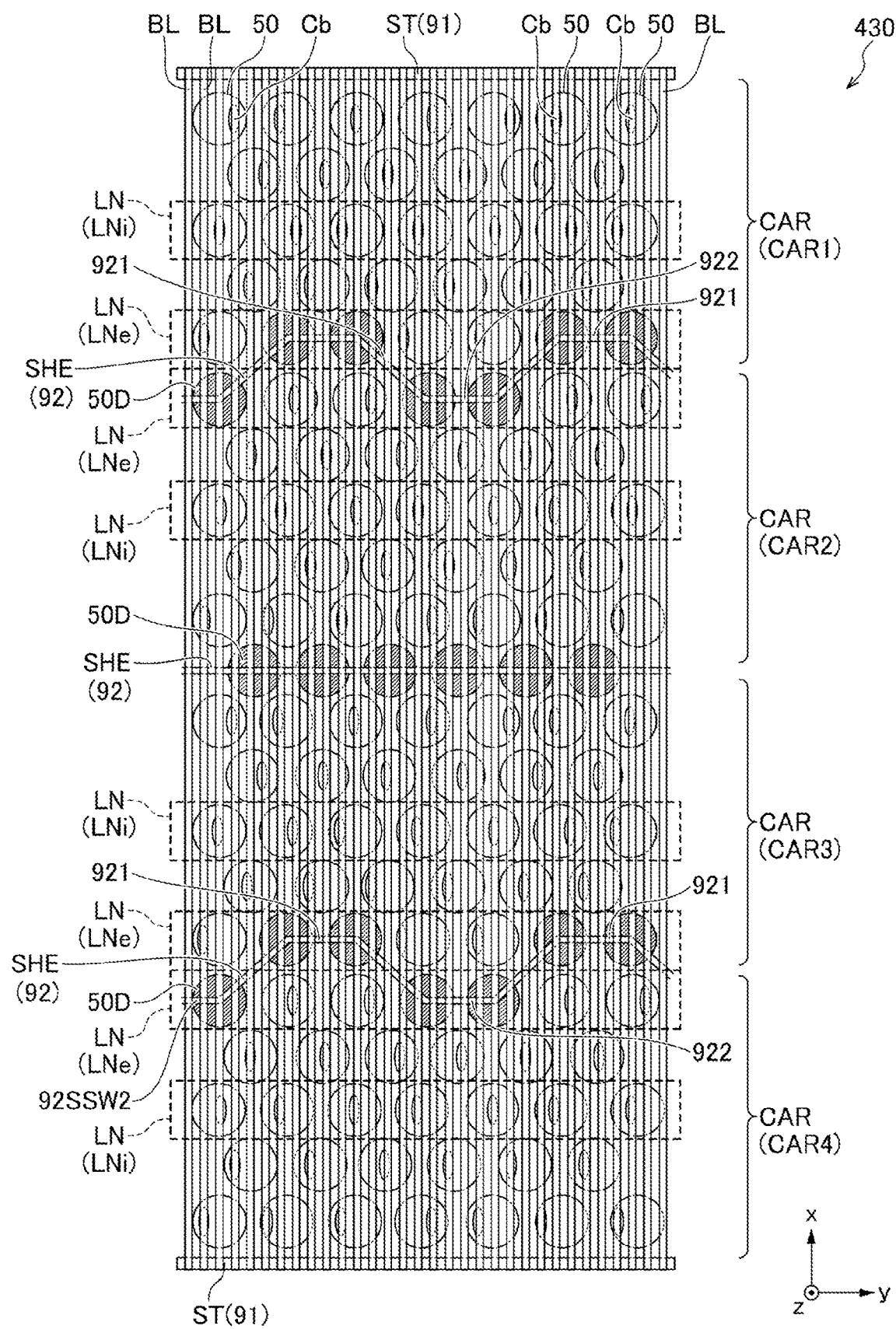
FIG. 16 schematically illustrates a plan view of an arrangement of pillars according to a sixth embodiment.

FIG. 16 schematically illustrates an arrangement of the pillars 50 and the like according to the sixth embodiment in the same manner as in FIG. 7. As illustrated in FIG. 16, in the sixth embodiment, the region between the pair of insulators 91 (slit ST) is divided into four cell regions CAR1, CAR2, CAR3, and CAR4 by the three insulators 92 (slit SHE).

In the present embodiment, the central slit SHE in the x direction extends linearly along the y direction. Directly under the central slit SHE, the dummy pillars 50D are arranged in a straight line in the y direction.

The shapes of the two slits SHE other than the above are the same as the shapes of the slits SHE in the first embodiment (FIG. 7). Further, the arrangement of the dummy pillars 50D directly under the slit SHE is also the same as that of the first embodiment.

Since the configuration of the cell regions CAR1 and CAR2 in the sixth embodiment is the same as the configuration of the first embodiment, the consecutive number can be regarded as 4.5. Since the configuration of the cell regions CAR3 and CAR4 is the same as the configuration of the first embodiment but inverted with respect to the y-z plane, the consecutive number can also be regarded as 4.5. Even with such a configuration, the same effect as that described in the first embodiment is obtained.

Figure 17A:
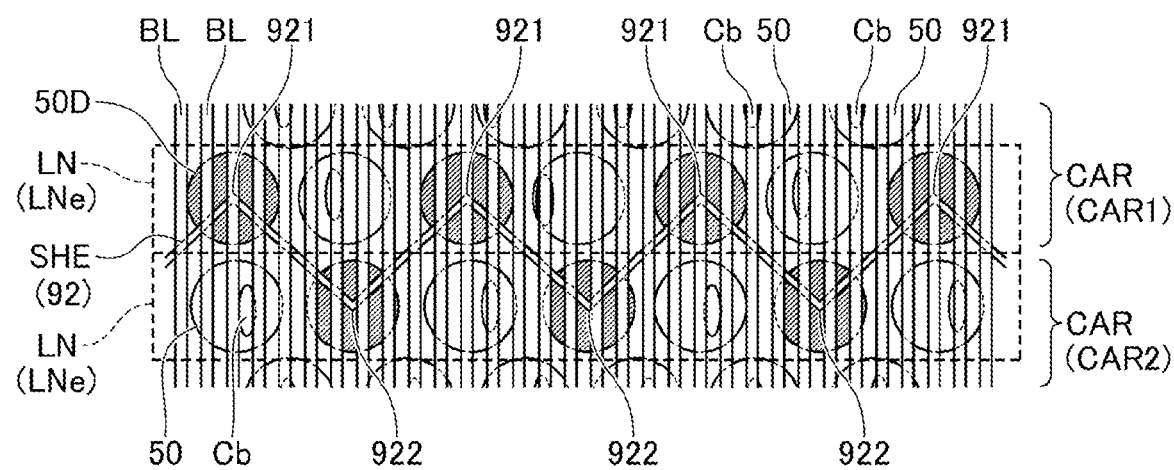
FIGS. 17A and 17B schematically illustrate a plan view of an arrangement of pillars according to certain modification examples.
Figure 17B:
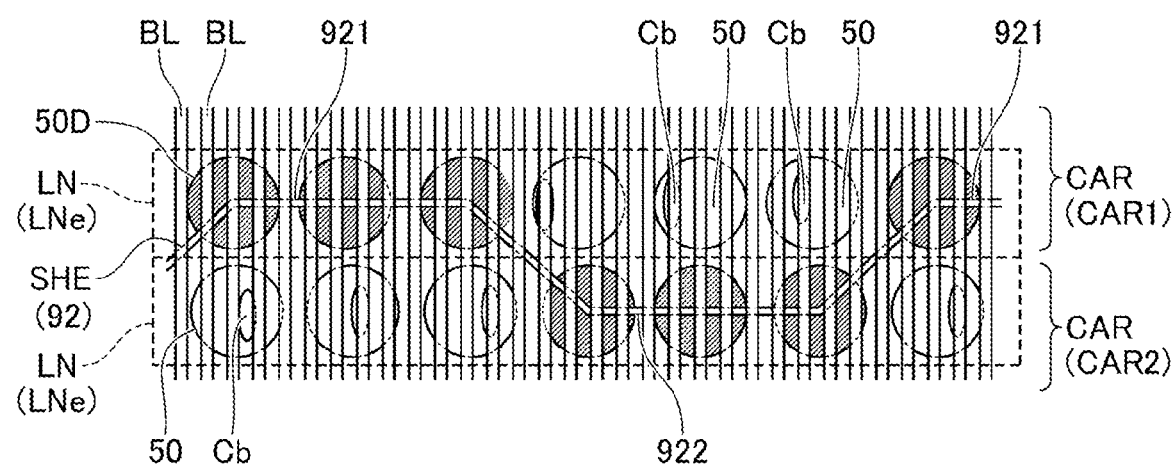
Figure 17B:
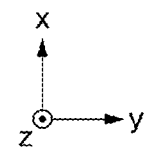

The shapes of the slit ST and the slit SHE (that is, the shapes of the insulators 91 and 92) are not limited to the examples described in the above embodiments, and various shapes may be adopted. FIGS. 17A and 17B illustrate modification examples in which the shape of the slit SHE is changed. For example, as illustrated in FIG. 17A, in the end row LNe, one pillar 50 and one dummy pillar 50D may be alternately arranged in the y direction, and then the slit SHE may pass directly above each dummy pillar 50D. As in this example, the arrangement pitch of the pillars 50 in the end row LNe may be enlarged more than the arrangement pitch of the pillars 50 in the inner row LNi at all intervals, not only a part.

Further, as illustrated in FIG. 17B, in the end row LNe, the three pillars 50 and the three dummy pillars 50D may be alternately arranged in the y direction, and then the slit SHE may pass directly above each dummy pillar 50D.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a plurality of conductor layers stacked in a first direction;
a plurality of bit lines spaced from one another in a second direction intersecting the first direction, each of the bit lines extending in a third direction intersecting the first and second directions;
a first row of pillars in the second direction, each of the pillars in the first row extending in the first direction through the plurality of conductor layers and having a semiconductor layer electrically connected to one bit line in the plurality of bit lines;
a second row of pillars in the second direction, each of the pillars in the second row extending in the first direction through the plurality of conductor layers and having a semiconductor layer electrically connected to one bit line in the plurality of bit lines;
a third row of pillars in the second direction, each of the pillars in the third row extending in the first direction through the plurality of conductor layers and at least one of the pillars in the third row having a semiconductor layer electrically connected to one bit line in the plurality of bit lines,
a fourth row of pillars in the second direction, each of the pillars in the fourth row extending in the first direction through the plurality of conductor layers and at least one of the pillars in the fourth row having a semiconductor layer electrically connected to one bit line in the plurality of bit lines,
the pillars in the first, second, third, and fourth rows being spaced from one another in the third direction and aligned in the third direction in this order; and
an insulator extending in the first direction into the plurality of conductor layers and electrically separating at least some of the conductor layers of the plurality of conductor layers into two different regions adjacent to each other in the third direction, wherein
at least a portion of a first straight line connecting centers of the pillars in the third row as viewed from the first direction overlaps at least a first portion of the insulator,
at least a portion of a second straight line connecting centers of the pillars in the fourth row as viewed from the first direction overlaps at least a second portion of the insulator, and
a first interval between adjacent pillars in the first row is less than a second interval between adjacent pillars in the third row.

2. The semiconductor storage device according to claim 1, further comprising:
a first dummy pillar extending in the first direction through the plurality of conductor layers below the insulator, the first dummy pillar not being electrically connected to any of the bit lines.

3. The semiconductor storage device according to claim 2, wherein the first dummy pillar is adjacent to one of the pillars in the third row in the second direction.

4. The semiconductor storage device according to claim 3, wherein a third interval between the first dummy pillar and the adjacent one of the pillars in the third row in the second direction is equal to the first interval.

5. The semiconductor storage device according to claim 1, further comprising:
a plurality of dummy pillars extending through the plurality of conductor layers in the first direction and being aligned in the second direction at positions between the adjacent pillars in the third row, each of the dummy pillars being below the insulator and not electrically connected to any of the bit lines.

6. The semiconductor storage device according to claim 1, wherein no pillar is below the insulator in the first direction.

7. The semiconductor storage device according to claim 1, wherein the insulator includes one or more third portions extending in a fourth direction that is in a plane parallel to the second and third directions but different from the second direction.

8. The semiconductor storage device according to claim 1, wherein
the pillars in the third row includes at least one group of pillars regularly arranged in the second direction with a same interval as the first interval, and
the pillars in the at least one group are shifted in the second direction with respect to the pillars in the second row.

9. The semiconductor storage device according to claim 1, wherein the insulator electrically separates some but not all of the conductor layers.

10. The semiconductor storage device according to claim 9, further comprising:
a second insulator extending in the first and second directions at an end of each of the conductor layers in the third direction.

11. The semiconductor storage device according to claim 10, wherein
a total number of rows of pillars between the insulator and the second insulator is six or less but more than four, and
at least one of pillars in the first or second row extends in the first direction below three of the bit lines.

12. The semiconductor storage device according to claim 9, further comprising:
a second insulator electrically separating some but not all of the conductor layers into two regions adjacent to each other in the third direction, and
the first and second rows of pillars are between the insulator and the second insulator.

13. A semiconductor storage device, comprising:
a plurality of conductor layers stacked in a first direction;
a plurality of bit lines spaced from each other in a second direction intersecting the first direction, each of the bit lines extending in a third direction intersecting the first and second directions;
an insulator electrically separating at least some of the conductor layers into first and second regions adjacent to each other in the third direction;
a first group of rows of pillars, the pillars in each row of the first group of rows being spaced from each other in the second direction, each row in the first group being spaced from each other in the third direction, each of the pillars in the first group extending through the plurality of conductor layers in the first direction in the first region and having a semiconductor layer electrically connected to one of the bit lines; and
a second group of rows of pillars, the pillars in each row of the second group being spaced from each other in the second direction each row in the second group being spaced from each other in the third direction, each of the pillars in the second group extending through the plurality of conductor layers in the first direction in the second region and having a semiconductor layer electrically connected to one of the bit lines, wherein
the total number of rows in the first group is less than the total number of rows in the second group,
the first group of rows of pillars includes a first row of pillars and a second row of pillars,
a first interval along the second direction between adjacent pillars in the first row is less than a second interval along the second direction between adjacent pillars in the second row,
the second group of rows of pillars includes a third row of pillars and a fourth row of pillars,
a third interval along the second direction between adjacent pillars in the third row is less than a fourth interval along the second direction between adjacent pillars in the fourth row,
the first interval is equal to the third interval, and
the second interval is not equal to the fourth interval.

14. The semiconductor storage device according to claim 13, wherein
- electrical connections of the semiconductor layers of the pillars in the first group of rows to the respective bit lines are switchable by application of a voltage to a first select gate line, and
- electrical connections of the semiconductor layers of the pillars in the second group of rows to the respective bit lines are switchable by application of a voltage to a second select gate line.

* * * * *